(12) United States Patent
Kiesel et al.

(10) Patent No.: US 7,718,948 B2
(45) Date of Patent: May 18, 2010

(54) MONITORING LIGHT PULSES

(75) Inventors: Peter Kiesel, Palo Alto, CA (US); Oliver Schmidt, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/633,323

(22) Filed: Dec. 4, 2006

(65) Prior Publication Data
US 2008/0128595 A1 Jun. 5, 2008

(51) Int. Cl.
*H01J 40/14* (2006.01)
(52) U.S. Cl. .................. 250/216; 250/208.2; 356/434; 385/39
(58) Field of Classification Search .............. 250/208.1, 250/208.2, 216, 578.1, 226; 356/432, 434, 356/435; 385/12, 31, 39
See application file for complete search history.

(56) References Cited

U.S. PATENT DOCUMENTS

| | | | |
|---|---|---|---|
| 2,708,389 | A | 5/1955 | Kavanagh |
| 3,973,118 | A | 8/1976 | LaMontagne |
| 4,455,089 | A | 6/1984 | Yeung et al. |
| 4,573,796 | A | 3/1986 | Martin et al. |
| 4,957,371 | A | 9/1990 | Pellicori et al. |
| 5,136,152 | A | 8/1992 | Lee |
| 5,144,498 | A | 9/1992 | Vincent |
| 5,151,585 | A | 9/1992 | Siebert |
| 5,166,755 | A | 11/1992 | Gat |
| 5,170,224 | A | 12/1992 | Terada et al. |
| 5,243,614 | A | 9/1993 | Wakata et al. |
| 5,666,195 | A | 9/1997 | Shultz et al. |
| 5,682,038 | A | 10/1997 | Hoffman |
| 5,784,507 | A | 7/1998 | Holm-Kennedy et al. |
| 5,793,485 | A | 8/1998 | Gourley |
| 5,825,792 | A | 10/1998 | Villeneuve et al. |
| 5,872,655 | A * | 2/1999 | Seddon et al. .............. 359/588 |
| 5,880,474 | A | 3/1999 | Norton et al. |
| 5,945,676 | A | 8/1999 | Chalil et al. |

(Continued)

FOREIGN PATENT DOCUMENTS

WO     WO 95/20144 A1     7/1995

OTHER PUBLICATIONS

Office communication in U.S. Appl. No. 11/316,241, mailed Apr. 16, 2008, 20 pages, published in PAIR.

(Continued)

*Primary Examiner*—Kevin Pyo
(74) *Attorney, Agent, or Firm*—Leading-Edge Law Group, PLC; Mark W. Hrozenchik

(57) ABSTRACT

To monitor light pulses from a light source, such as a laser, sense signals are provided to a photosensing component or array, causing photosensing during a series of one or more sense periods for the light pulse. Each light pulse can be provided through a transmission structure, such as a layered structure, that provides output light with an energy-dependent position on the photosensing component. A pulse's sensing results can be used to obtain a set of one or more differential quantities; for example, with a photosensing array, two cells of the array can be read out and compared. For a narrow band light pulse, a transmission structure can provide a spot on the photosensing component, and the light spot position can be sensed.

34 Claims, 18 Drawing Sheets

U.S. PATENT DOCUMENTS

| | | |
|---|---|---|
| 6,034,981 A | 3/2000 | Kim |
| 6,040,578 A | 3/2000 | Malin et al. |
| 6,295,130 B1 | 9/2001 | Sun et al. |
| 6,307,623 B1 | 10/2001 | Papuchon et al. |
| 6,456,411 B1 | 9/2002 | Ishikawa et al. |
| 6,490,302 B1 | 12/2002 | Koishi et al. |
| 6,594,022 B1 | 7/2003 | Watterson et al. |
| 6,621,837 B2 | 9/2003 | Le Gall et al. |
| 6,630,999 B2 | 10/2003 | Shroder |
| 6,639,679 B2 | 10/2003 | Frojdh |
| 6,700,664 B1 | 3/2004 | Honda et al. |
| 6,717,965 B2 | 4/2004 | Hopkins, II et al. |
| 6,763,046 B2 | 7/2004 | Baillargeon et al. |
| 6,785,002 B2 | 8/2004 | Zarrabian et al. |
| 6,795,190 B1 | 9/2004 | Paul et al. |
| 6,796,710 B2 | 9/2004 | Yates et al. |
| 6,801,553 B2 | 10/2004 | Imaki et al. |
| 6,809,865 B2 | 10/2004 | Chen |
| 6,839,140 B1 | 1/2005 | O'Keefe et al. |
| 6,867,420 B2 | 3/2005 | Mathies et al. |
| 6,870,149 B2 | 3/2005 | Berezin |
| 6,924,898 B2 | 8/2005 | Deck |
| 6,930,819 B2 | 8/2005 | Chu et al. |
| 6,980,297 B2 | 12/2005 | Maeda |
| 7,012,696 B2 | 3/2006 | Orr et al. |
| 7,022,966 B2 | 4/2006 | Gonzo et al. |
| 7,046,357 B2 | 5/2006 | Weinberger et al. |
| 7,057,799 B2 | 6/2006 | Chu |
| 7,167,239 B2 | 1/2007 | Yamamoto |
| 7,268,868 B2 | 9/2007 | Kiesel et al. |
| 7,291,824 B2 | 11/2007 | Kiesel et al. |
| 7,310,153 B2 | 12/2007 | Kiesel et al. |
| 7,315,667 B2 | 1/2008 | Schmidt et al. |
| 7,358,476 B2 | 4/2008 | Kiesel et al. |
| 7,386,199 B2 | 6/2008 | Schmidt et al. |
| 7,387,892 B2 | 6/2008 | Kiesel et al. |
| 7,433,552 B2 | 10/2008 | Kiesel et al. |
| 7,456,953 B2 | 11/2008 | Schmidt et al. |
| 7,471,399 B2 | 12/2008 | Kiesel et al. |
| 7,479,625 B2 | 1/2009 | Kiesel et al. |
| 7,522,786 B2 | 4/2009 | Kiesel et al. |
| 2003/0161024 A1 | 8/2003 | Zhang et al. |
| 2003/0189711 A1 | 10/2003 | Orr et al. |
| 2004/0004980 A1 | 1/2004 | Mazed |
| 2004/0032584 A1 | 2/2004 | Honda et al. |
| 2004/0038386 A1 | 2/2004 | Zesch et al. |
| 2004/0228375 A1 | 11/2004 | Ghosh et al. |
| 2005/0041703 A1 | 2/2005 | Momiuchi et al. |
| 2005/0162650 A1 | 7/2005 | Yamamoto |
| 2006/0039009 A1 | 2/2006 | Kiesel et al. |
| 2006/0046312 A1 | 3/2006 | Kiesel et al. |
| 2006/0092413 A1 | 5/2006 | Kiesel et al. |
| 2006/0121555 A1 | 6/2006 | Lean et al. |
| 2006/0138313 A1 | 6/2006 | Tennant et al. |
| 2006/0193550 A1 | 8/2006 | Wawro et al. |
| 2007/0070347 A1 | 3/2007 | Scherer et al. |
| 2007/0076210 A1 | 4/2007 | Kiesel et al. |
| 2007/0146704 A1 | 6/2007 | Schmidt et al. |
| 2007/0147189 A1 | 6/2007 | Schmidt et al. |
| 2007/0147726 A1 | 6/2007 | Kiesel et al. |
| 2007/0147728 A1 | 6/2007 | Schmidt et al. |
| 2007/0148760 A1 | 6/2007 | Kiesel et al. |
| 2008/0197272 A1 | 8/2008 | Kiesel et al. |
| 2009/0220189 A1 | 9/2009 | Kiesel et al. |

OTHER PUBLICATIONS

Notice of Allowance and Fee(s) Due in U.S. Appl. No. 11/316,303, dated May 14, 2008, 12 pages, published in PAIR.

Amendment with Information Disclouse in U.S. Appl. No. 11/316,241, dated Jul. 11, 2008, 18 pages, published in PAIR.

Schaefer, P., Williams, R.D., Davis, G.K., and Ross, R.A., "Accuracy of Position Detection Using a Position-Sensitive Detector", IEEE Transactions on Instrumentation and Measurement, vol. 47, No. 4, Aug. 1998, pp. 914-919.

Henry, J., and Livingstone, J., "Wavelength response of thin-film optical position-sensitive detectors", J. Opt. A: Pure Appl. Opt., vol. 4, 2002, pp. 527-534.

Office communication in U.S. Appl. No. 11/316,241, mailed Oct. 23, 2007, 28 pages, published in PAIR.

Amendment with Information Disclosure in U.S. Appl. No. 11/316,241, dated Jan. 23, 2008, 20 pages, published in PAIR.

Office communication in U.S. Appl. No. 11/316,303, mailed Oct. 22, 2007, 3 pages, published in PAIR.

Office communication in U.S. Appl. No. 11/316,303, mailed Jan. 10, 2008, 10 pages, published in PAIR.

Office communication in U.S. Appl. No. 11/316,303, mailed Jan. 26, 2007, 21 pages, published in PAIR.

Amendment with Information Disclosure in U.S. Appl. No. 11,316,303, dated Apr. 26, 2007, 18 pages, published in PAIR.

Office communication in U.S. Appl. No. 11/316,303, mailed Aug. 31, 2007, 19 pages, published in PAIR.

Amendment After Final Rejection in U.S. Appl. No. 11/316,303, dated Oct. 4, 2007, 14 pages, published in PAIR.

Amendment with Request for Continued Examination in U.S. Appl. No. 11/316,303, dated Nov. 30, 2007, 15 pages, published in PAIR.

Response with Terminal Disclaimer and Information Disclosure in U.S. Appl. No. 11,316,303, dated Apr. 4, 2008, 4 pages, published in PAIR.

Koo, J.-Y., and Akamatsu, I., "A simple real-time wavemeter for pulsed lasers," Meas. Sci. Technol., vol. 2, 1991, pp. 54-58.

Hamamatsu Corporation, "Position Sensitive Detectors," printed from sales.hamamatsu.com on Aug. 25, 2006, 8 pages.

Wippich, M., and Dessau, K.L., "Tunable Lasers and Fiber-Bragg-Grating Sensors," The Industrial Physicist, Jun./Jul. 2003, pp. 24-27.

Othonos, A., and Kalli, K., "Fiber-Bragg Gratings—Fundamentals and Applications in Telecommunications and Sensing," Artech House, Norwood, MA, 1999, pp. 304-330.

Spear, J.D., and Russo, R.E., "Low noise position sensitive detector for optical probe beam deflection measurements," Rev. Sci. Instrum., vol. 67, No. 7, Jul. 1996, pp. 2481-2484.

Vollmer, F., Arnold, S., Braun, D., Teraoka, I., and Libchaber, A., "Multiplexed DNA Quantification by Spectroscopic Shift of Two Microsphere Cavities," Biophysical Journal, vol. 85, Sep. 2003, pp. 1-6.

Kondziela, J., "Accurately Measure Laser Spectral Characteristics," EXFO Electro-Optical Engineering, Inc., 2005, 5 pages.

Supplemental Amendment with Information Disclosure in U.S. Appl. No. 11,316,241, submitted Nov. 17, 2008, 18 pages, published in PAIR.

Office communication in U.S. Appl. No. 11/633,302, mailed Sep. 5, 2008, 34 pages, published in PAIR.

Amendment with Information Disclosure in U.S. Appl. No. 11,633,302, submitted Dec. 3, 2008, 34 pages.

Notice of Allowance and Fee(s) Due in U.S. Appl. No. 11/316,241, mailed Dec. 1, 2008, 17 pages, published in PAIR.

Office communication in U.S. Appl. No. 11/633,302, mailed Apr. 24, 2009, 17 pages.

Office communication in U.S. Appl. No. 11/316,241, mailed Mar. 24, 2009, 4 pages.

Response to Interview Summary in U.S. Appl. No. 11/633,302, submitted May 22, 2009, 4 pages.

Amendment After Final Rejection in U.S. Appl. No. 11/633,302, submitted Jun. 12, 2009, 32 pages.

Office communication U.S. Appl. No. 11/633,302, mailed Jul. 23, 2009, 5 pages.

Amendment With Request for Continued Examination in U.S. Appl. No. 11/633,302, submitted Jul. 23, 2009, 31 pages.

Notice of Allowance and Fee(s) Due in U.S. Appl. No. 11/633,302, mailed Dec. 30, 2009, 11 pages, published in PAIR.

* cited by examiner

MONITORING LIGHT PULSES

This application is related to the following co-pending applications, each of which is hereby incorporated by reference in its entirety: "Chip-Size Wavelength Detector", U.S. patent application Ser. No. 10/922,870, now published as U.S. Patent Application Publication No. 2006/0039009; "Biosensor Using Microdisk Laser", U.S. patent application Ser. No. 10/930,758, now published as U.S. Patent Application Publication No. 2006/0046312; "Anti-resonant Waveguide Sensors", U.S. patent application Ser. No. 10/976,434, now published as U.S. Patent Application Publication No. 2006/0092413; "Transmitting Light with Photon Energy Information", U.S. patent application Ser. No. 11/316,241; "Sensing Photon Energies of Optical Signals", U.S. patent application Ser. No. 11/315,926; "Sensing Photon Energies Emanating From Channels or Moving Objects", U.S. patent application Ser. No. 11/315,992; "Providing Light To Channels Or Portions", U.S. patent application Ser. No. 11/316,660; "Sensing Photon Energies Emanating from Channels", U.S. patent application Ser. No. 11/315,386; "Photosensing Throughout Energy Range and in Subranges", U.S. patent application Ser. No. 11/316,438; "Obtaining Analyte Information", U.S. patent application Ser. No. 11/316,303; "Propagating Light to be Sensed", U.S. patent application Ser. No. 11/315,387; and "Position-Based Response to Light", U.S. patent application Ser. No. 11/633,302.

BACKGROUND OF THE INVENTION

The present invention relates generally to techniques that monitor light, such as techniques that monitor light pulses. Such techniques can, for example, perform photon energy monitoring.

U.S. Pat. No. 5,243,614 describes a wavelength monitor/stabilizer for a narrow bandwidth laser. The monitor/stabilizer uses parameters derived by measuring diameters of interference fringes given by the laser's beam and given by a reference light. The interference fringes are detected with plural image sensors. In contrast to techniques in which light intensity for one laser pulse can be read for every trigger signal to an image sensor, the period of laser pulses may be shorter than the time period for reading; therefore, exposure time can be an integer multiple of the period of the laser pulses.

Various other techniques have been proposed for monitoring light from a laser or other light source, including various techniques for monitoring wavelength.

It would be advantageous to have improved techniques for monitoring light, including improved light pulse monitoring techniques.

SUMMARY OF THE INVENTION

The invention provides various exemplary embodiments, including systems, methods, apparatus, and devices. In general, the embodiments involve monitoring light pulses. In some embodiments, pulse signals and sense signals together synchronize a light pulse's emission period and sense period.

These and other features and advantages of exemplary embodiments of the invention are described below with reference to the accompanying drawings.

DETAILED DESCRIPTION

Figure 1:
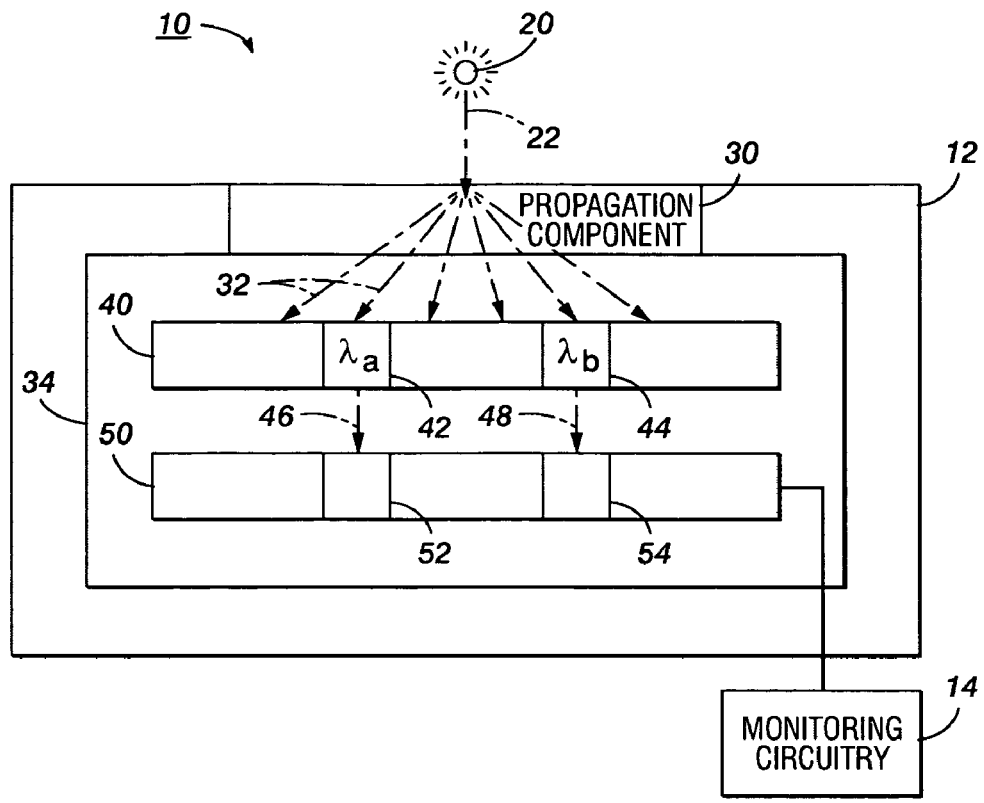
FIG. 1 is a schematic diagram of a photon energy monitoring system with a light sensing assembly that provides sensing results in response to light with a laterally varying photon energy distribution.

In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the claims.

"Light" refers herein to electromagnetic radiation of any wavelength or frequency; unless otherwise indicated, a specific value for light wavelength or frequency is that of light propagating through vacuum. The term "photon" refers herein to a quantum of light, and the term "photon energy" refers herein to the energy of a photon. Light can be described as having a "photon energy distribution", meaning the combination of photon energies that are included in the light; highly monochromatic light, for example, has a photon energy distribution with one peak energy value. A photon energy distribution can be specified in space and time: For example, a photon energy distribution can be specified as a function of position, such as on a surface, or as a function of time; a photon energy distribution that is "homogeneous" is substantially the same at all relevant positions, such as the positions of a surface, while a photon energy distribution that is "stable" is substantially the same at all relevant times.

Light can also be described as provided by a "light source," which, unless otherwise specified, refers herein to any device, component, or structure that can provide light of the type described; examples of light sources relevant to the below-described implementations include various kinds of pulsed and unpulsed lasers and laser structures, light emitting diodes (LEDs), superluminescent LEDs (SLEDs), resonant cavity LEDs, monochromators, and so forth. A "tunable light source" is a light source that provides light with a predominant photon energy that can be changed in response to a signal or operation of some kind.

The term "laser" is used herein to mean any region, element, component, or device in which transitions between energy levels can be stimulated to cause emission of coherent light, such as in the ultraviolet, visible, or infrared regions of the spectrum. A "laser structure" is any structure that includes one or more lasers. A "laser cavity" is a region of a laser in which transitions can be stimulated to cause emission.

Many lasers and other light sources can be operated to provide "light pulses", where the expression "light pulse", or simply "pulse", refers to emitted light that has a finite duration. In typical applications, light pulse duration is brief, such as approximately a second or less, and may be much shorter, such as in the femtosecond range.

To "propagate" light through a region or structure is to transmit or otherwise cause the light to propagate through the region or structure. The light may be referred to as "propagated light" or "propagating light".

"Photon energy information" refers herein to information about photon energy, such as information about wavelength, frequency, wavelength shift, frequency shift, or a distribution of wavelengths or frequencies. "Absolute photon energy information" is information about a given photon energy value, such as a specific wavelength or frequency, while "relative photon energy information" is information that relates two photon energy values, whether measured concurrently or at different times.

The interchangeable terms "wavelength shift", "frequency shift", and "photon energy shift" all refer to a shift between photon energies, which is one example of a "change" in photon energy distribution. More generally, a "change" in photon energy distribution occurs whenever a photon energy distribution before an event and a photon energy distribution after the event cannot be made congruent by performing substantially the same normalization at all points in one of the distributions.

The various exemplary implementations described below address problems that arise in monitoring photon energy, where the term "monitoring" photon energy includes sensing, detecting, measuring, determining, controlling, tuning, selecting, locking, stabilizing, and other operations that involve obtaining photon energy information such as wavelength or wavelength shift information. One of those problems is the difficulty of obtaining high relative wavelength resolution rapidly and without bulky, expensive equipment; for example, it is difficult to read out information about very small (e.g. approximately $10^{-4}$ nm to a few nm) wavelength shifts. Another is the difficulty of obtaining high absolute wavelength resolution. It can also be problematic to provide sensitivity to wavelength and not to intensity of incident light. These problems are applicable, for example, in controlling or otherwise monitoring wavelength or photon energy of light from lasers and other sources of light that can be characterized as narrow band, monochromatic, or single frequency light.

To "photosense" is to sense photons, and to "photosense quantity" of photons is to obtain information indicating a quantity of the photons. Photons that are photosensed are sometimes referred to herein as "incident photons". A surface at which photosensing occurs is referred to herein as a "photosensitive surface".

A "photosensor" is used herein to refer generally to any element or combination of elements that senses photons, whether by photosensing quantity or any other information about the photons. A photosensor could, for example, provide an electrical signal or other signal that indicates results of sensing, such as a signal indicating quantity of incident photons; in general, signals from a photosensor that indicate results of sensing are referred to herein as "sensing results". If electrical sensing events occur in a photosensor in response to incident photons, the photosensor may integrate or otherwise accumulate the results of the electrical sensing events during a time period referred to herein as a "sensing period" or "sense period".

A "range of photon energies" or an "energy range" is a range of energy values that photons can have. An energy range can be described, for example, as a range of wavelengths or a range of frequencies or, in appropriate cases, by the range's central wavelength or frequency and possibly also the range's width. A "subrange" of a range of photon energies is a part of the range, and can be similarly described. A central wavelength or frequency or other value indicating a central photon energy of a range or subrange is sometimes referred to herein as a "central energy", and may be obtained in various ways, such as by finding an energy that has maximum intensity or that is another type of central value such as a mean or median of the distribution of light within the range or subrange.

In general, the upper and lower boundaries and widths of ranges and subranges are approximate. To provide output photons or to photosense quantity of photons "throughout", "within", or "in" a range or subrange means to provide photons or to obtain information about quantity of photons that are predominantly within the range or subrange. In typical cases, between 60-90% of the provided photons or sensed quantity of photons have energies within the range or subrange, but the percentage could be lower or higher. In some applications, 90% or even 95% or more of the provided photons or sensed quantity of photons have energies within the range or subrange.

Some of the photosensing implementations described herein employ structures with one or more dimensions smaller than 1 mm, and various techniques have been proposed for producing such structures. In particular, some techniques for producing such structures are referred to as "microfabrication." Examples of microfabrication include various techniques for depositing materials such as growth of epitaxial material, sputter deposition, evaporation techniques, plating techniques, spin coating, printing, and other such techniques; techniques for patterning materials, such as etching or otherwise removing exposed regions of thin films through a photolithographically patterned resist layer or other patterned layer; techniques for polishing, planarizing, or otherwise modifying exposed surfaces of materials; and so forth.

In general, the structures, elements, and components described herein are supported on a "support structure" or "support surface", which terms are used herein to mean a structure or a structure's surface that can support other structures. More specifically, a support structure could be a "substrate", used herein to mean a support structure on a surface of which other structures can be formed or attached by microfabrication or similar processes.

The surface of a substrate or other support surface is treated herein as providing a directional orientation as follows: A direction away from the surface is "up", "over", or "above", while a direction toward the surface is "down", "under", or "below". The terms "upper" and "top" are typically applied to structures, components, or surfaces disposed away from the surface, while "lower" or "underlying" are applied to structures, components, or surfaces disposed toward the surface. In general, it should be understood that the above directional orientation is arbitrary and only for ease of description, and that a support structure or substrate may have any appropriate orientation.

Unless the context indicates otherwise, the terms "circuitry" and "circuit" are used herein to refer to structures in which one or more electronic components have sufficient electrical connections to operate together or in a related manner. In some instances, an item of circuitry can include more than one circuit. An item of circuitry that includes a "processor" may sometimes be analyzed into "hardware" and "software" components; in this context, "software" refers to stored or transmitted data that controls operation of the processor or that is accessed by the processor while operating, and "hardware" refers to components that store, transmit, and operate on the data. The distinction between "software" and "hardware" is not always clearcut, however, because some components share characteristics of both; also, a given software component can often be replaced by an equivalent hardware component without significantly changing operation of circuitry.

Circuitry can be described based on its operation or other characteristics. For example, circuitry that operates to monitor light is sometimes referred to herein as "monitor circuitry" and circuitry that operates to sense light is sometimes referred to herein as "sensing circuitry".

An "integrated circuit" or "IC" is a structure with electrical components and connections produced by microfabrication or similar processes. An IC may, for example, be on or over a substrate on which it was produced or another suitable support structure. Other components could be on the same support structure with an IC, such as discrete components produced by other types of processes.

Implementations of ICs described herein include features characterized as "cells" and "arrays", terms that are used with related meanings: An "array" is an arrangement of "cells". An array may also include circuitry that connects to electrical components within the cells such as to select cells or transfer signals to or from cells, and such circuitry is sometimes referred to herein as "array circuitry". In contrast, the term "peripheral circuitry" is used herein to refer to circuitry on the same support surface as an array and connected to its array circuitry but outside the array. The term "external circuitry" is more general, including not only peripheral circuitry but also any other circuitry that is outside a given cell or array.

Some of the implementations below are described in terms of "rows" and "columns", but these terms are interchangeable. Also, rows and columns are described herein as examples of "lines". Within an array, a "line" of cells refers herein to a series of cells through which a line can be drawn without crossing areas of cells that are not in the line. For example, in a two-dimensional array in which cells have uniform areas, a line of cells could be a row, a column, a diagonal, or another type of straight line; more generally, a line of cells could be straight or could include one or more non-straight features, such as curves or angles.

An IC includes a "photosensor array" if the IC includes an array of cells, and at least some of the cells include respective photosensors. A cell that includes a photosensor may also include "cell circuitry", such as circuitry that makes connections with the photosensor, that transfers signals to or from the photosensor, or that performs any other operation other than photosensing. In general, a cell's photosensor and cell circuitry are within a bounded area of the array, an area sometimes referred to herein as the "cell's area". The part of a cell's area in which an incident photon can be photosensed is referred to herein as "sensing area".

In an application of an IC that includes a photosensor array, circuitry that "responds to" one or more photosensors can be any circuitry that, in operation, receives information from the photosensors about their photosensing results through an electrical connection. Circuitry that responds to a photosensor could be circuitry in the same cell as the photosensor, or it could be array circuitry, peripheral circuitry, or other external circuitry, or it could include any suitable combination of cell circuitry, array circuitry, peripheral circuitry, and other external circuitry.

An IC is or includes a "position-sensitive detector" if it includes a substantially continuous photosensitive surface and it provides electrical signals indicating a position resulting from a pattern of incident light on the photosensitive surface. For example, the signals could be two currents whose normalized difference is proportional to a centroid of the incident light pattern.

Figure 2:
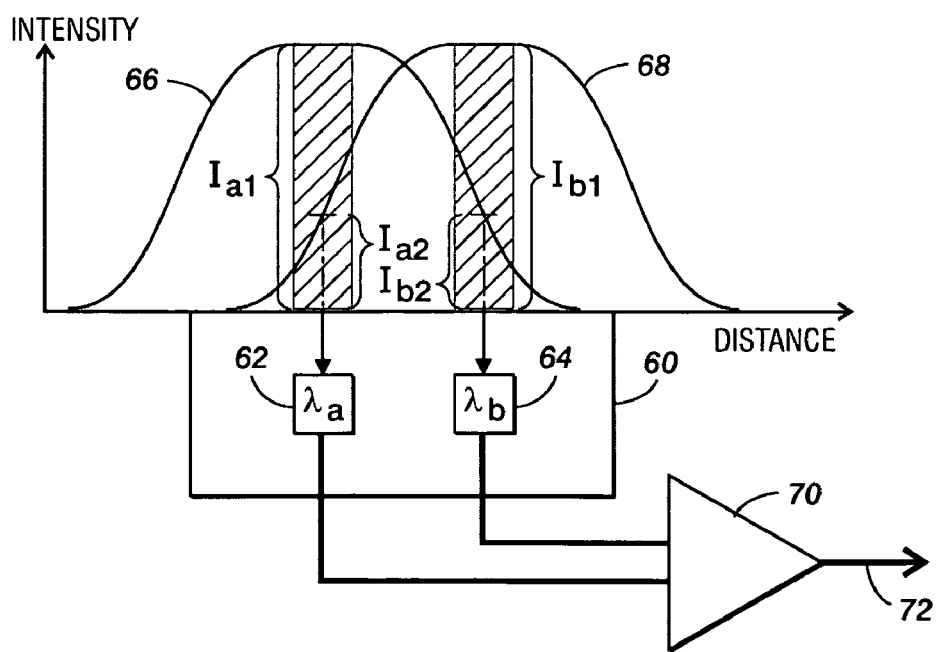
FIG. 2 is a schematic top view of a photosensor array that could be used in the light sensing assembly of FIG. 1, together with a graph showing intensity as a function of position for two patterns of incident light.

FIGS. 1 and 2 illustrate general features of a photon energy monitoring system 10. System 10 includes detector 12 and monitoring circuitry 14. Light source 20 provides light 22, which is received by detector 12, and circuitry 14 can receive electrical signals from detector 12.

As with other implementations described below, the implementation in FIGS. 1 and 2 involves combinations of parts or components. As used herein, a "system" is a combination of two or more parts or components that can perform an operation together. A system may be characterized by its operation: for example, a "photon energy monitoring system" is a system that monitors photon energy; a "processing system" is a system that performs data or signal processing; and so forth.

Within a system, components and parts may be referred to in a similar manner. One component of a monitoring system, for example, can be a "detector component" or simply "detector", meaning a component that detects light; similarly, a "monitoring component" performs a monitoring operation; an "optical component" performs an optical operation; a "photosensing component" performs a photosensing operation; and other examples are defined further below. Other parts or components can be characterized by their structure, such as a "film component", meaning a component that includes one or more films of material.

In the implementations described below, structures, systems, or parts or components of structures or systems may sometimes be referred to as "attached" to each other or to other structures, systems, parts, or components or visa versa, and operations are performed that "attach" structures, systems, or parts or components of structures or systems to each other or to other things or visa versa; the terms "attached", "attach", and related terms refer to any type of connecting that could be performed in the context. One type of attaching is "mounting", which occurs when a first part or component is attached to a second part or component that functions as a support for the first. In contrast, the more generic term "connecting" includes not only "attaching" and "mounting", but also making other types of connections such as electrical connections between or among devices or components of circuitry.

A combination of one or more parts connected in any way is sometimes referred to herein as a "structure". Similarly to a component, a structure may be described by its operation, such as a "support structure" that can operate as a support as described above; other examples are defined below. In addition, a structure may be characterized by the nature of its parts or the way in which they are connected; for example, a "layered structure" is a structure that includes one or more layers.

Light source 20 illustratively provides light 22 with a photon energy distribution that can be monitored by monitoring circuitry 14. As explained in greater detail below, the photon energy distribution of light 22 can vary over time in response to internal or external conditions of light source 20. The external conditions could, for example, include conditions that are controlled in order to affect the photon energy distribution of light 22, but can also include other conditions, sometimes referred to herein as "environmental conditions," that are not controlled but that nevertheless can affect the photon energy distribution. Therefore, monitoring circuitry 14 can obtain information not only about the photon energy distribution of light 22, but also about internal conditions and environmental conditions of light source 20 and also about the effect of conditions that are being controlled.

Detector 12 could be implemented in many ways, and FIG. 1 illustrates some components that may occur in exemplary implementations. Propagation component 30 receives light 22 from light source 20 and propagates the light 22 to other components, as suggested by rays 32.

As used herein a "light propagation component" or simply "propagation component" is any feature, surface, interface, layer, lens, transmission structure as described below, or other component that provides light in response to received light. In general, a light propagation component has an "entry surface", meaning a surface at which it receives entering light, and an "exit surface", meaning a surface at which it provides exiting light. Between its entry and exit surfaces, a propagation component can perform one or more functions on the light, including transmitting, guiding, collimating, imaging, focusing, spreading, and so forth. For example, a propagation component could include one or more optical fibers to transmit light 22 received at its entry surface from light source 20 to its exit surface.

From the exit surface of a propagation component, light may travel to other components in which it is photosensed, as illustrated by light sensing assembly 34 in FIG. 1. As will become more apparent from the implementations described below, satisfactory operation of a system as in FIG. 1 may require that the photon energy distribution provided to light sensing assembly 34 have certain characteristics that may be specific to the implementation; a photon energy distribution with the appropriate characteristics may be referred to herein as a "suitable distribution". In some implementations described below, light source 20 may directly provide a suitable light distribution, such as if light 22 is already collimated, homogeneous, and stable, as would be true in many cases if light source 20 were a laser. Often, however, a propagation component is necessary or helpful in obtaining a suitable distribution.

In general, a wide variety of configurations could be used to produce a suitable distribution. Although the examples below are described in terms of light from optical fiber endings, point-like outputs, or broad area sources, the same or similar configurations could be used for light from integrated optical components such as waveguides. Also, light from a light source could be coupled into one or more optical fibers and transmitted or guided by the fibers to one or more photosensing components in an assembly. For example, light from a laser can be either directly incident on a photosensing component or can be transmitted to a photosensing component via an optical fiber.

In some cases, an ideal photon energy distribution would be both stable and homogeneous over a light sensing assembly's entry surface. This ideal may, however, be difficult to accomplish in practice. For example, if light source 20 is a laser with a high coherence length and if interference develops within a propagation component, then interference fringes, speckles, or other inhomogeneous features may arise; this problem is unlikely to arise, on the other hand, with less coherent light sources such as LEDs. Inhomogeneous effects, such as those described above, can develop or vary over time, so that they also can provide a source of instability; another source of instability may arise for an optical setup that includes reflective components and a laser cavity, because reflection back into the laser cavity could result in feedback and instability. Some of the implementations described below address these problems.

In the example illustrated in FIG. 1, rays 32 diverge within propagation component 30, suggesting that component 30 spreads light 22 from source 20 to produce a suitable distribution. As used herein a "light spreading component" or simply "spreading component" is a propagation component for which the exiting light's intensity distribution at any given time has a greater variance in at least one direction than the entering light to which it responds, where variance is expressed as a distance across the respective surface. The exiting light from a spreading component can be described as "spreaded" over a greater extent of the exit surface than the entering light occupies in the entry surface, though the entry and exit surfaces may be closely spaced surfaces in some implementations. Where the entry surface of light sensing assembly 34 is larger than the effective width of light 22, spreading can be important to produce a suitable distribution.

Light sensing assembly 34 receives the light provided by component 30, and, in response, provides sensing results such as electrical signals. Assembly 34 illustratively includes transmission structure 40. A structure that "transmits" photons, sometimes referred to herein as a "transmission structure", is any material structure through which light can propagate. It is not necessary that there be a one-to-one relationship between photons that enter a transmission structure and photons that exit from it as long as the structure provides exiting photons in response to entering photons as a result of light propagation through the structure.

More generally, to "transmit" photons is to perform an operation by which exiting photons at an exit position are provided in response to entering photons at an entry position as a result of light propagation between the entry and exit positions. To "transmit only" a specified set of photons from a first position to a second refers to an operation that transmits photons from the first position to the second, but predominantly photons in the specified set. As with providing photons and photosensing, described above, if a transmission structure transmits only a specified set of photons, between 60-90% of the transmitted photons are in the specified set, but the percentage could be lower or higher. In some applications, 90% or even 95% or more of the photons are in the specified set.

One type of transmission structure is a "coating", meaning a layered structure of light-transmissive material that is on or over another component such as a photosensor array or position-sensitive detector. Various examples of coatings are described below.

A transmission structure provides (and a photosensor receives from a transmission structure) photons "throughout", "within", or "in" a range or subrange if the provided photons are predominantly within the range or subrange. As in other contexts described above, between 60-90% of the photons from a transmission structure typically have energies within the range or subrange, but the percentage could be lower or higher. In some applications, 90% or even 95% or more of the photons have energies within the range or subrange.

A transmission structure can be characterized by an "energy transmission function" or simply "transmission function" that relates positions in the transmission structure to photon energies that are transmitted at the positions. For example, if a position transmits photons within a specific subrange but not outside the specific subrange, the transmission function at that position passes the specific subrange but not other subranges.

A transmission structure is "laterally varying" if its transmission function varies as a function of position within its exit surface, such position being referred to herein as "lateral position". The variation in transmission function can, for example, vary according to a gradient, which can be a "constant transmission gradient" if it varies continuously or uniformly in a lateral direction or a "step-like transmission gradient" if it varies in a step-like manner in a lateral direction. Where a transmission structure is two-dimensional, it could have a constant transmission gradient in one lateral direction and a step-like transmission gradient in another. A transmission function that does not vary laterally may be referred to as "homogeneous", and a "homogeneous transmission structure" has a homogeneous transmission function.

Structure 40 transmits in such a way that, in light provided at its exit surface, photon energies vary as a function of lateral position, referred to herein as a "laterally varying photon energy distribution" or simply as a "laterally varying energy distribution". This feature is illustrated in FIG. 1 by regions 42 and 44 in structure 40. As shown, region 42 transmits light in a subrange centered about wavelength $\lambda_a$. Similarly, region 44 transmits light in a subrange centered about wavelength $\lambda_b$. As a result, the light from regions 42 and 44, represented respectively by rays 46 and 48, is incident on photosensing components 50 at different positions, represented respectively by position 52 and position 54. Therefore, if output photon energy from light source 20 changes from $\lambda_a$ to $\lambda_b$, this change will be indicated by a change in the light detected at positions 52 and 54.

FIG. 1 therefore illustrates the importance of spreading light to be sensed by assembly 34: If light 22 from light source 20 were not spread over the entry surface of transmission structure 40, but were instead incident only on a small area of transmission structure 40, the light would only reach a corresponding small area of photosensing components 50. In this case, the wavelength information that would otherwise be sensed in other areas of photosensing components 50 would be lost. In other words, spreading is necessary so that photosensing components 50 can provide signals that accurately indicate wavelength information from the output light.

As described in greater detail below, the design of detector 12 depends primarily on the properties of light 22 from source 20, such as whether it is monochromatic or spectrally broad and whether it is parallel or divergent. Other factors affecting the design of detector 12 include wavelength resolution and energy range.

If source 20 is a laser or other laser structure, light 22 will be narrow band and will emanate from a small light emitting area, whereas light 22 would be broader band and would emanate from a larger surface if source 20 were an LED. More generally, light sources can be pulsed or can emit continuously, and the emitted light can be collimated or divergent.

Semiconductor laser structures, such as edge emitting semiconductor lasers and vertical cavity surface-emitting lasers (VCSELs), for example, generally emit narrow band light from small emission surfaces and the emitted light is divergent. Because of the small emission area, the light is easy to collimate or focus, such as by using a lens.

Feedback into such laser structures can be controlled using anti-reflection coatings or tilted optics. Because the light can be very coherent, it can produce interference patterns or speckles that change with wavelength. Propagation components that produce suitable distributions of light from these sources can include single-mode optical fibers and diffusers; to be an effective propagation component, however, a single-mode optical fiber must be compatible with the light source's output wavelength.

In contrast to laser structures, LEDs are generally-broader band light sources in which light emanates from a large surface. It may be difficult to collimate or focus light from such a source, but a homogeneous light distribution can be produced, such as by using a diffuser. Since the light is not very coherent, interference and feedback are not issues.

In several implementations described below, light from a light source is transmitted by transmission structure 40 in such a way that a "light spot" is provided on photosensing components 50 at a respective position for a wavelength, for a narrow band of photon energy, for a subrange of photon energies, or for another set of photon energies. The term "light spot," as used herein, refers to a distinguishable high intensity region of a pattern of light received by a photosensing component in response to which the photosensing component is capable of providing information resulting from the higher intensity region's position, referred to herein as a "light spot position" or simply "spot position".

A light spot position for a wavelength or for another set of photon energies is an example of an "energy-dependent position", a term used herein to refer generally to a position that depends on photon energy. Other examples of energy-dependent positions that are described below include "central energy positions" and "peak energy positions".

In some implementations, a photosensing component might provide information resulting from one or more positions even when the received pattern of light does not include a distinguishable light spot. For example, where a photon energy subrange has a central energy, it is possible to obtain information resulting from the central energy's position, such as information about a position of maximum incident intensity, without distinguishing a light spot as such. The term "central energy position" is used herein to refer to such a position, which is an example of an energy-dependent position.

As used herein, information "results from" one or more positions if the information depends in some way on the positions. As used herein, the term "position information" refers to any type of information resulting from one or more positions, such as positions of one or more light spots or intensity maxima. For example, position information could indicate one or more positions, it could indicate a change or shift of position, it could indicate magnitude or direction of movement of position, and so forth. Position information could take any appropriate form, including signals, outputs, stored data, etc. A change between two positions is sometimes referred to herein as a "shift" or a "move"; neither of these expressions implies, however, that the change follows a straight or continuous line or obeys any other constraint on the path between the two positions.

In some implementations described below, a shift or move of position is "caused by" or "resulting from" a shift or other change in photon energy, such as a wavelength shift, a change in a photon energy subrange, a change in a subrange's central energy, etc. In such contexts, the terms "caused by" and "resulting from" refer to a relationship in which the shift or move of position immediately follows and corresponds to the shift or other change in photon energy.

A photosensing component could concurrently receive a number of light spots and the light spots could be arbitrarily close together, provided that the photosensing component can provide sensing results from which independent information about each spot can be obtained. In general, sensing results may themselves include position information or may be read out in a way that supplies position information; in any case, sensing results may be said to "result from" or "depend on" one or more positions.

Implicit in the above definition of "light spot" are both lower and upper size constraints for a given implementation: A light spot must be sufficient in size that the photosensing component can continue to provide sensing results resulting from its spot position despite movement of the light spot; and a light spot must not be so large that the photosensing component cannot provide sensing results resulting from its spot position, as would be the case, for example, if the light spot's higher intensity region were larger than the total area of the photosensing component.

Photosensing components 50 could be implemented in many ways, including with various ICs that include devices with photosensitive surfaces that include discrete cells such as photosensor arrays, devices with continuous photosensitive surfaces such as position-sensitive detectors, or any other type of photosensing components that can provide sensing results resulting from light spot positions. For example, photosensing components 50 could be implemented as a one-dimensional photosensor array with a coating as described below. In addition, photosensing components 50 could alternatively be implemented as a coated position-sensitive detector, as described in U.S. Patent Application Publication No. 2006/0039009, incorporated herein by reference in its entirety. FIG. 2 shows array 60, an example of a photosensor array that could implement photosensing components 50.

Array 60 in FIG. 2 includes cells 62 and 64, labeled to show that cell 62 is at position 52 in FIG. 1, and therefore receives predominantly light in a subrange around its central wavelength $\lambda_a$, while cell 64 is at position 54 and receives predominantly light in a subrange around its central wavelength $\lambda_b$. A "central wavelength", or other "central value", of a photon energy subrange refers herein to a wavelength or other photon energy value about which the subrange is approximately centered. Similarly, light 22 from light source 20 could have or be provided about one or more "peak energy values" in a given application, meaning maximum values of photon energy subranges in which intensity can significantly exceed intensities in nearby subranges. As will be understood from the above definition of "light spot", a light spot may similarly have a "peak intensity position", meaning a position at which intensity is at a maximum for the light spot. Where a light spot position depends on photon energy, its peak intensity position is also an energy-dependent position.

In the example illustrated in FIG. 2, light 22 can have two peak energy values $\lambda_a$ and $\lambda_b$, as would occur if a change in one or more environmental conditions (such as electrical power, temperature, etc.) resulted in a wavelength shift of light source 20 between $\lambda_a$ and $\lambda_b$. Similarly, light 22 from source 20 could be in a "narrow band" of energies in a given application if it has a peak energy value and the subrange in which intensity significantly exceeds nearby intensities is approximately one-tenth or less of the application's energy range; in contrast, "broadband" generally refers to light that has an energy distribution that is more uniform than narrow band light across a relatively broad energy range and that contains a significant light intensity in all energy subranges of interest. In general, subranges of interest can extend from a few picometers to several tens of nanometers, depending on the application. For example, an application using LEDs will involve light in subranges that are broader than narrow band but sensing results can nevertheless depend on position if different subranges have respective positions that are distinguishable.

More generally, a wavelength shift between wavelengths $\lambda_a$ and $\lambda_b$ or another change in photon energy distribution at the input surface of transmission structure 40 can change "relative quantities" of photons provided at positions 52 and 54, meaning that the quantities provided at the two positions have a different relation to each other after the shift than they did before it. For example, the quantities could increase or decrease, but by amounts such that the quantity at one position become a larger or smaller fraction of the quantity at the other position; the quantity at one location could change from being less than the quantity at the other position to being greater; or one quantity could increase while the other decreases; etc.

The graph at the top of FIG. 2 shows the relationship between light intensity and position across array 60 in response to two different patterns of incident light from light source 20. The first pattern, in which the incident light has a peak energy value $\lambda_a$, results in a light spot on array 60 that has an intensity distribution represented by curve 66; the second distribution, with a peak energy $\lambda_b$, similarly results in a light spot with an intensity distribution represented by curve 68. As will be understood, the first light spot, represented by curve 66, may follow a continuous series of positions until it reaches the position of the second light spot, represented by curve 68, such as if the wavelength of light source 20 makes a continuous transition from $\lambda_a$ to $\lambda_b$ rather than a discrete transition or jump.

The graph also shows quantities of photons sensed by cells 62 and 64 in response to the first and second spots. When the first spot is provided on array 60, cell 62 senses a quantity proportional to $I_{a1}$ and cell 64 senses a quantity proportional to $I_{b1}$; when the second spot is on array 60, on the other hand, cell 62 senses a quantity proportional to $I_{a2}$ and cell 64 senses a quantity proportional to $I_{b2}$. As will be seen, the relative quantities sensed by cells 62 and 64 change, with the first spot's relative quantity $(I_{a1}/I_{b2})$ being greater than unity and the second spot's relative quantity $(I_{a2}/I_{b2})$ being less than unity. Similarly, the difference $(I_{a1}-I_{b1})$ is a positive quantity whereas the difference $(I_{a2}-I_{b2})$ is a negative quantity. Furthermore, if a similar comparison is made with other adjacent or nearby cells, the peak intensity position of each spot can be approximated by finding the cell with the highest sensed quantity.

This technique is one of a wide variety of different approaches to finding the peak intensity position of a spot. For example, a more sophisticated approach could obtain the closest fit of a given set of sensed quantities to a Gaussian curve, and then use the maximum of the Gaussian curve as the light spot's position; this approach would be more likely to succeed for a large light spot with a higher intensity region that extends over a number of cells of a photosensing array, and may not be as effective for a small light spot, in which case it may be more appropriate to take the cell with the maximum sensed quantity as the position. Note that the position of a light spot on a position-sensitive detector is independent, to an extent, from the size of the light spot; if the detector provides two output photocurrents $I_1$, and $I_2$, a differential signal $(I_1-I_2)/(I_1+I_2)$ indicates the centroid of a light spot but not its variance.

Another approach would be to compare the sensed quantities read out from all the cells of array 60 with a threshold to select a subset of higher intensity cells. The sensed quantities in these cells could then be compared, such as by a pairwise comparison technique, to find those of highest intensity. The position of the light spot could then be determined by interpolating the positions of the cells of highest intensity, or, if there is a single cell of highest intensity, by taking its position. The distance between cells of maximum intensity could also be compared with a threshold value to eliminate situations in which there is more than one maximum, indicating that the light distribution does not include a single clearly defined spot. The elimination of situations with multiple maxima can be helpful because a pattern of light with multiple maxima may not change in a linear manner as it moves across a photosensing array, and could be especially problematic for a position-sensitive detector that cannot handle multiple spots. On the other hand, if more sophisticated techniques are available, such as software for following multiple spots across a photosensing array, distributions with multiple maxima may be tractable provided that the maxima are sufficiently separated.

In the particular example illustrated in FIG. 2, another approach is available: rather than obtaining a light spot's position or a light spot's centroid, a shift in light spot position can be directly detected, providing a differential quantity resulting from positions of the light spot but without a separate calculation of the light spot's position. For example, if the quantity $I_{62}$ sensed by cell 62 is compared with the quantity $I_{64}$ sensed by cell 64 and a transition occurs such that $I_{62}$ begins greater than $I_{64}$, but becomes less than $I_{64}$, this indicates a shift from the position indicated by curve 66 to the position indicated by curve 68. This is an example of how it may be easier to detect a shift in photon energy than it is to detect an absolute value of photon energy.

FIG. 2 also shows how the quantities of photons sensed by cells 62 and 64 can be compared, such as by comparator 70. Comparator 70 could, for example, be biased so that the output signal on line 72 indicates a light spot boundary between cells 62 and 64 or indicates a change in photon energy distribution of light 22 from light source 20 that causes a wavelength shift between wavelengths $\lambda_a$ and $\lambda_b$. If readout signals from cells 62 and 64 are obtained but from no other cells, this would provide an example of readout signals "obtained from only two cells" of an array.

As used herein, an operation or a component of circuitry "compares" if the result indicates a relationship between or among two or more signals or values being compared, such as difference, equality, which is greater, which is less, whether the difference is greater or less than a quantity or meets some other criterion, and so forth.

If it indicates the difference between the photosensed quantities of cells 62 and 64, the value of the output signal on line 72 would be an example of a "differential quantity", which refers herein to a value that indicates difference between or among two or more quantities. A differential quantity could, for example, be an unbiased or biased analog output value from a differential amplifier or other analog comparator; a simple difference obtained by subtraction of two digital values, one or both of which could be normalized or otherwise adjusted; a ratio obtained by analog or digital circuitry; a value obtained by combining related differential quantities, such as differences between each of two or more quantities and a third quantity such as a mean; or any other analog or digital value that includes information about difference. To obtain a differential quantity from more than two quantities, for example, the quantities could be grouped into two groups; the quantities in each group could be combined, such as by summing and, if necessary, by weighting to compensate for different group sizes; and then the combined quantities could be directly compared. A "differential signal" generally refers herein to a signal that indicates a differential quantity. More generally, a "differential output" refers herein to a set of one or more signals that provides information of any kind about a difference between or among two or more quantities, including, for example, magnitude, sign, or change.

The principles set forth above can also be applied to light sources other than lasers, other laser structures, and LEDs. In each case, an appropriate combination of components can be used to obtain satisfactory monitoring of photon energy.

Photosensing components 50 can include various photosensitive elements, chosen to be appropriate for the incident light intensity. For low power incident light, exemplary solutions include: (1) a small detector surface area, which is beneficial because the total light is not distributed over a large area and the intensity per unit area stays high—this solution is also inexpensive, but, due to a limited detector size, the wavelength range and resolution may also be limited; (2) arrays such as cooled CCDs, avalanche photodiodes, and photomultiplier tubes (PMTs) that provide increased signal-to-noise ratio but are expensive; or (3) intensified CCD arrays that enable single photon counting but are very expensive. For high power incident light, intensity is not critical; therefore, in addition to any of the above exemplary solutions, it may be possible to use inexpensive and simple position-sensitive devices (PSDs) or photodetector arrays, possibly even simple double or quad pin detectors.

Photosensing components can obtain sensing results that depend on position in various ways, including providing position-based output currents from a PSD, integrating current or accumulating free charge carriers in cells at different positions of an array, and various other techniques, some of which are described below. In each case, the sensing results can be read out with appropriate techniques. While the output currents of a PSD or photodiode may in many cases be read out continuously, sensing results from cells of arrays are typically read out after sensing periods, such as with CCD or CMOS techniques. In such arrays, each cell's sensing period typically begins with an appropriate initialization operation, and each cell's sensing period ends by the time the cell's sensing result is read out, in some cases ending when readout occurs. The beginnings and endings of sensing periods are typically controlled by signals provided through array circuitry: It is therefore possible to sample at an appropriate rate, such as when light is received continuously; it is also possible to synchronize sensing periods with incident light, such as when light is received from a pulsed laser, described in greater detail below. If necessary, it is also possible to use similar circuitry for readout of PSDs or photodiodes.

Figure 3:
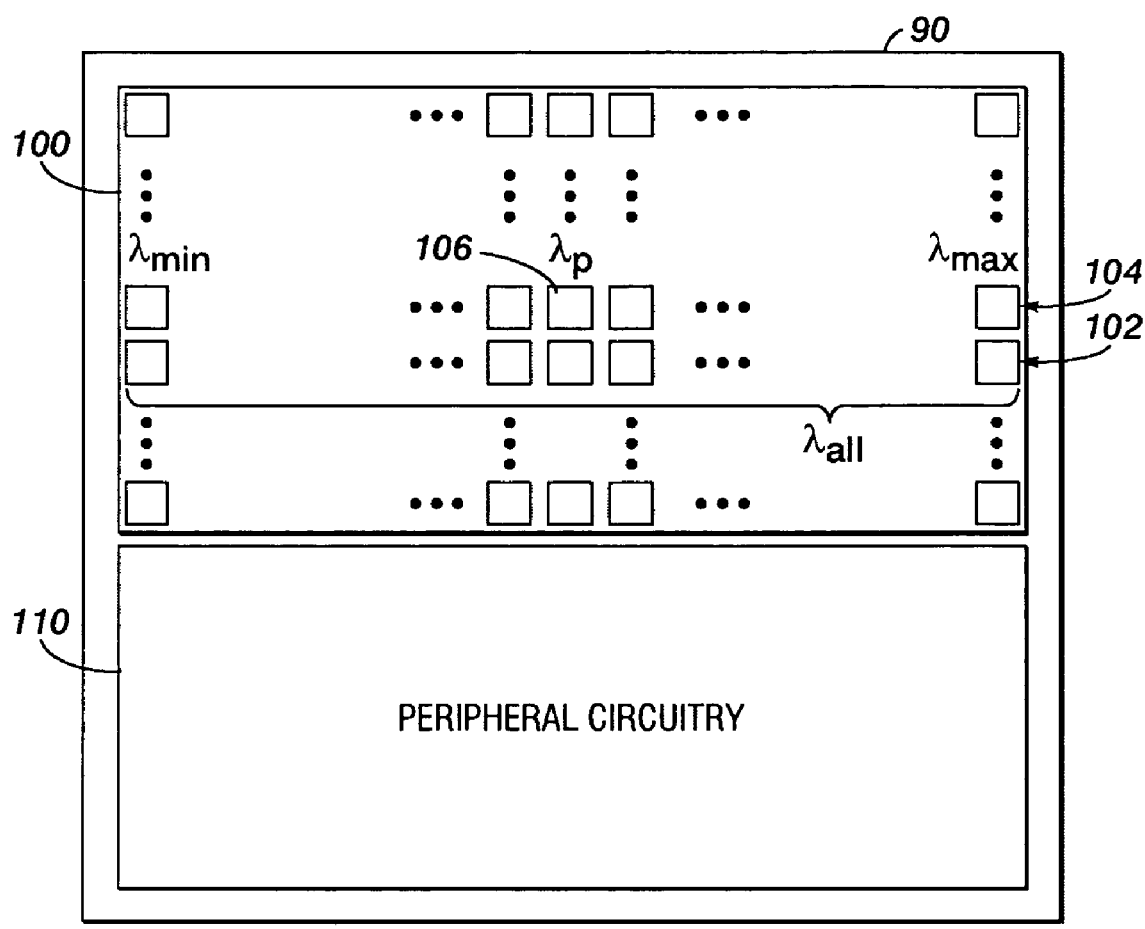
FIG. 3 is a schematic plan view of an integrated circuit (IC) with a photosensor array that can be used in the light sensing assembly of FIG. 1.

Light sensing assembly 34 in FIG. 1 can therefore be implemented in a wide variety of ways, including various types of photosensor arrays and PSDs. FIG. 3 is a schematic view of an exemplary IC with a photosensor array that can be used in some such implementations. FIGS. 4-11 illustrate various implementations of assembly 34 that can include an IC like that shown in FIG. 3, or that could alternatively be implemented with PSDs as described in U.S. Patent Application Publication No. 2006/0039009, incorporated herein by reference in its entirety.

IC 90 in FIG. 3 includes photosensor array 100, which is illustratively a two-dimensional array, with at least two rows of cells that include photosensors. Different rows or other parts of array 100 can be provided with different coatings or can be otherwise structured so that their cells photosense different ranges or subranges of photon energies. As a result, the information obtained from a single IC can provide a detailed analysis of incident photons over a broad range of photon energies. In addition, reference cells, such as the cells in row 102, can be used to provide a spatially resolved real-time reference signal, allowing for correction of inhomogeneities, for example.

Within an array, a "pair" of cells is any two cells; unless otherwise specified, the cells in a pair need not have any other specific relationship to each other. The cells in a pair are "near each other" if the distance between them meets a suitable criterion for nearness, such as being no greater than ten times the maximum diameter of the larger of the cells. In general, for example, two cells that are adjacent are also near each other. More generally, a set of cells are all "nearby" another cell if each cell in the set and the other cell, taken as a pair, are near each other. A feature of array 100 is that it includes one or more reference cells that are nearby to a subrange cell, such as by being adjacent to the subrange cell.

Each cell in row 102 photosenses photons throughout a suitable range, characterized as $\lambda_{all}$, to produce a reference for a nearby cell in row 104. For implementations in which it is advantageous to have signal strengths of the same order from a cell in row 102 and its paired cell in row 104, the cell in row 102 must be different from the cells in row 104. For example, it could have a different sensing area or it could have a gray filter coating different than a coating over the paired cell in row 104.

Each cell in row 104, on the other hand, photosenses a respective subrange between $\lambda_{min}$ and $\lambda_{max}$, with illustrative cell 106 photosensing a subrange centered around $\lambda_p$. IC 90 also includes array circuitry (not shown) as well as peripheral circuitry 110 which perform various operations relating to readout of photosensed information from array 100.

One advantage of the technique illustrated in FIG. 3 is that IC 90 provides a compact photosensor array that can be used within a device, such as in a photon energy monitoring device. Results from more than one such IC within a device may be combined to obtain more complete sensing. In general, photosensed quantities or other results of photosensing are "combined" when they are included together in any data structure or signal, possibly after one or more data processing or signal processing operations.

Figure 4:
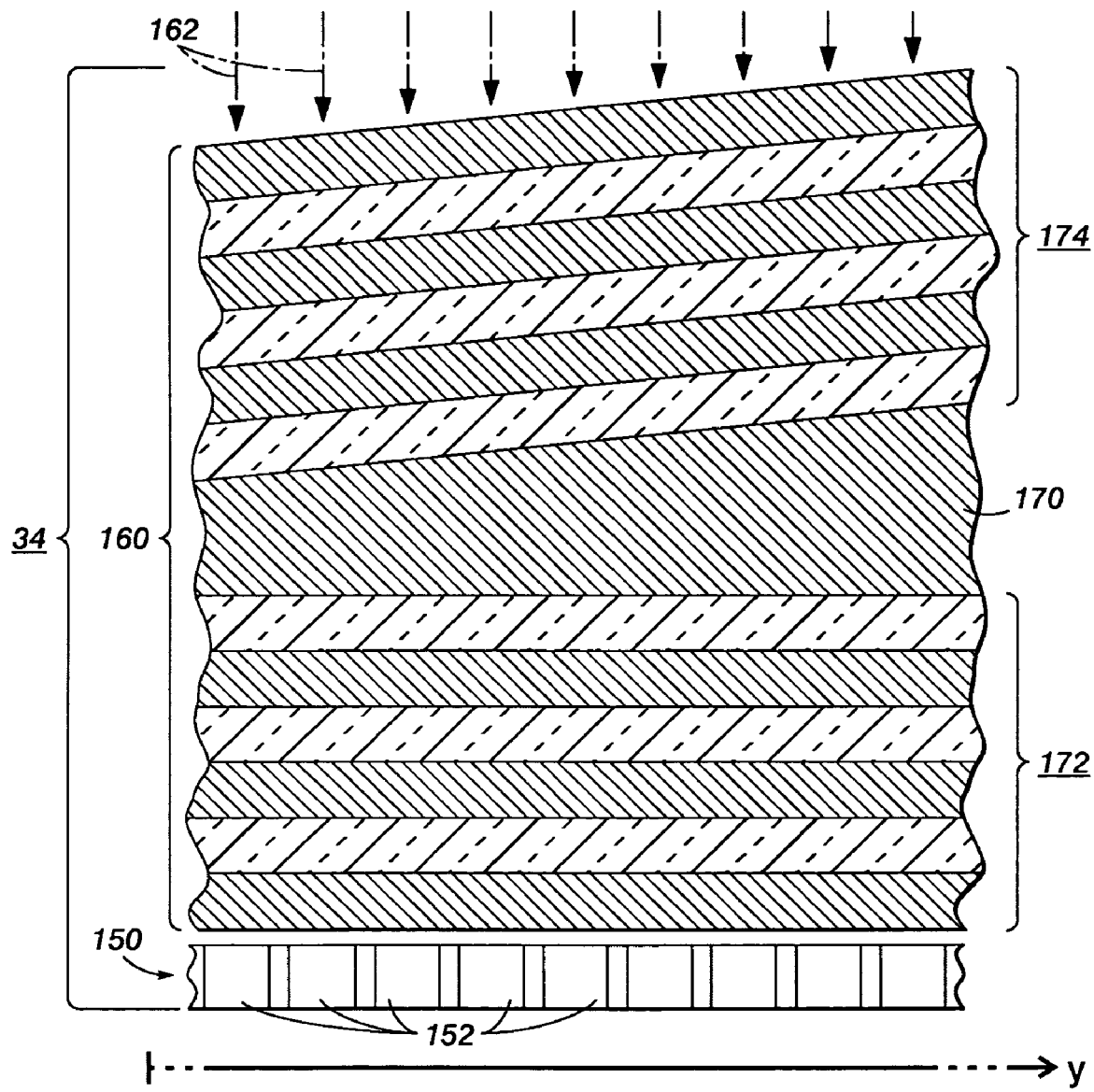
FIG. 4 is a schematic cross-sectional view of an implementation of an assembly that can be used in FIG. 1.

FIG. 4 illustrates an implementation of assembly 34, showing in greater detail how cells of an array photosense subranges, such as in row 104 in FIG. 3. As in other implementations described herein, assembly 34 in FIG. 4 can be supported by a suitable support component. As explained below, FIG. 4 illustrates an example of a laterally varying transmission structure, but, as illustrated below in relation to FIG. 17, a laterally varying energy distribution could also be produced with a homogeneous transmission structure.

In FIG. 4, a cross-section has been taken through a fragment 150 of a photosensor array, with cells 152 of the fragment 150 shown schematically in cross-section. Over cells 152 is a transmission structure 160 that receives incident light 162, such as from any of the below-described implementations for receiving light from a light source.

Transmission structure 160 can, for example, be a film with laterally varying light transmission properties as described, for example, in U.S. Patent Application Publication No. 2006/0039009, incorporated herein by reference in its entirety. In the portion of transmission structure 160 shown in FIG. 4, wedge-shaped transmissive cavity 170 is enclosed between reflective films 172 and 174, forming a wedge-shaped Fabry-Perot etalon. Because its thickness varies as a function of position along the y-axis, transmission structure 160 will transmit different wavelengths as a function of position along the y-axis. Such a function is sometimes referred to herein as a "wavelength-position function".

As will be understood from the above definition of the expression "light spot", the photon energy distribution received by transmission structure 160 and its wavelength-position function together determine whether one or more light spots are produced on fragment 150 of the photosensor array. For example, if the received photon energy distribution includes a high intensity in an appropriately sized subrange of photon energies, while intensities in adjacent photon energy subranges are very low, a light spot will be produced on certain cells 152. As a result, photosensed quantities from the cells can be used to obtain sensing results that depend on light spot position. More generally, the received photon energy distribution and the wavelength-position function together determine whether sensing results that depend on position can be obtained, possibly even in situations in which a light spot as defined above may not occur. These principles will also be true for the other implementations of assembly 34 described below.

Transmission structure 160 can be produced with appropriate coatings on or otherwise over a photosensor array. Films 172 and 174 and cavity 170 could all be produced, for example, by exposure to deposition beams in an evaporation chamber; films 172 and 174 with uniform thicknesses could be produced by appropriate on-axis deposition, while cavity 170 with laterally varying thickness can be produced by appropriate off-axis deposition. FIG. 4 illustratively shows films 172 and 174 as relatively thick compared to cavity 170, which would be appropriate for layers of non-metallic material such as $SiO_2$, $TiO_2$, or $Ta_2O_5$, with thicknesses designed as described below; such materials are typically used to produce Bragg mirrors by depositing thin alternating layers with low absorption coefficients and large differences in refractive indices. If films 172 and 174 are reflective metal, however, they could be much thinner.

For an implementation with non-metallic material, specific thicknesses of cavity 170 and films 172 and 174 could be designed from the desired transmitted wavelength λ and the refractive index n of cavity 170. The thickness of cavity 170 is typically chosen to be λ/(2n) or an integer multiple thereof, while the thicknesses of Bragg mirror layers within films 172 and 174 are typically λ/(4n). The number of pairs of such layers in each of films 172 and 174 can vary between a few (e.g. 2-5) all the way up to 20 or 30, depending on the difference in refractive index between the two materials used, the desired transmission band width, and the desired stop band reflectivity. Therefore, in typical implementations, films 172 and 174 are much thicker than cavity 170, as suggested in FIG. 4.

Figure 5:
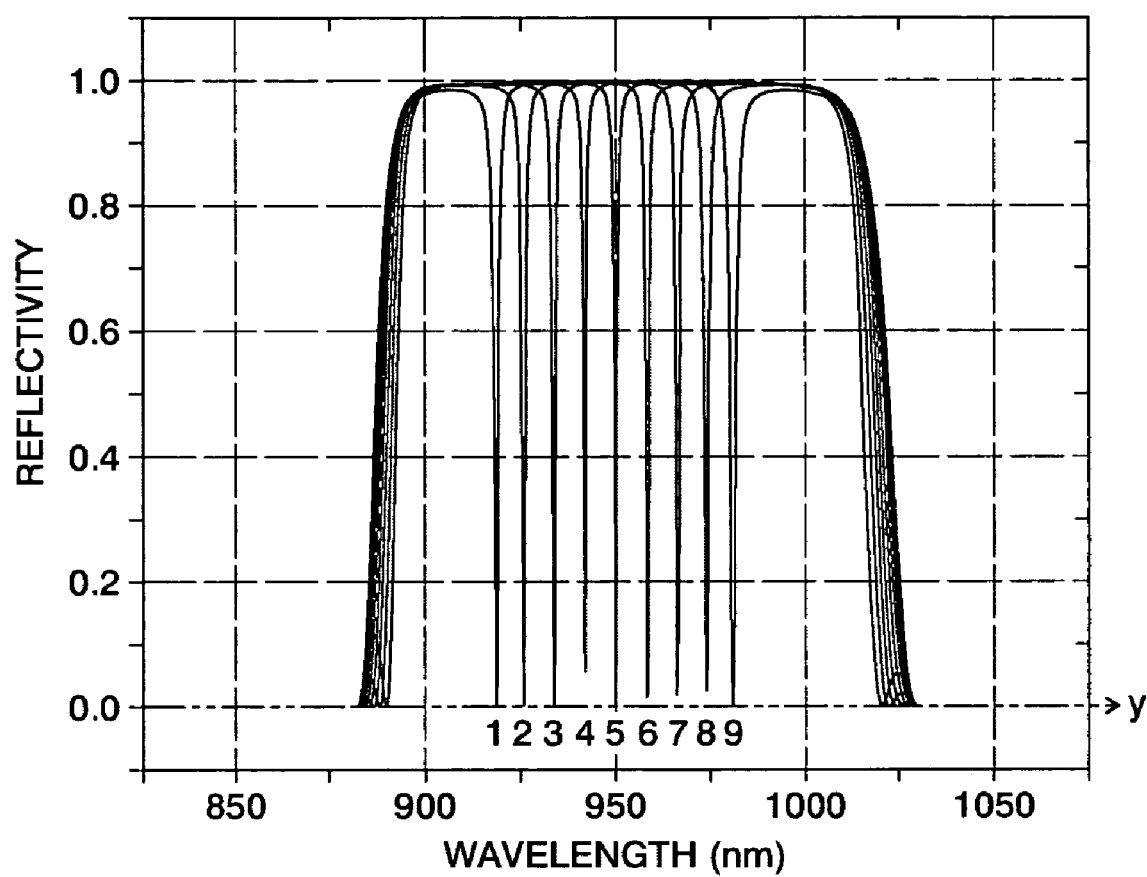
FIG. 5 is a graph illustrating laterally varying light transmission properties of a transmission structure as in FIG. 4.

FIG. 5 illustrates the laterally varying light transmission properties of transmission structure 160. Because its thickness varies as a function of position along the y-axis, cavity 170 transmits different wavelengths as a function of position along the y-axis. Wavelengths of photons predominantly transmitted to nine of cells 152 as in fragment 150 are illustrated by the low reflectivity minima labeled 1 through 9. As can be seen, the high-transmissivity photon energy range for transmission structure 160 varies laterally.

Figure 6:
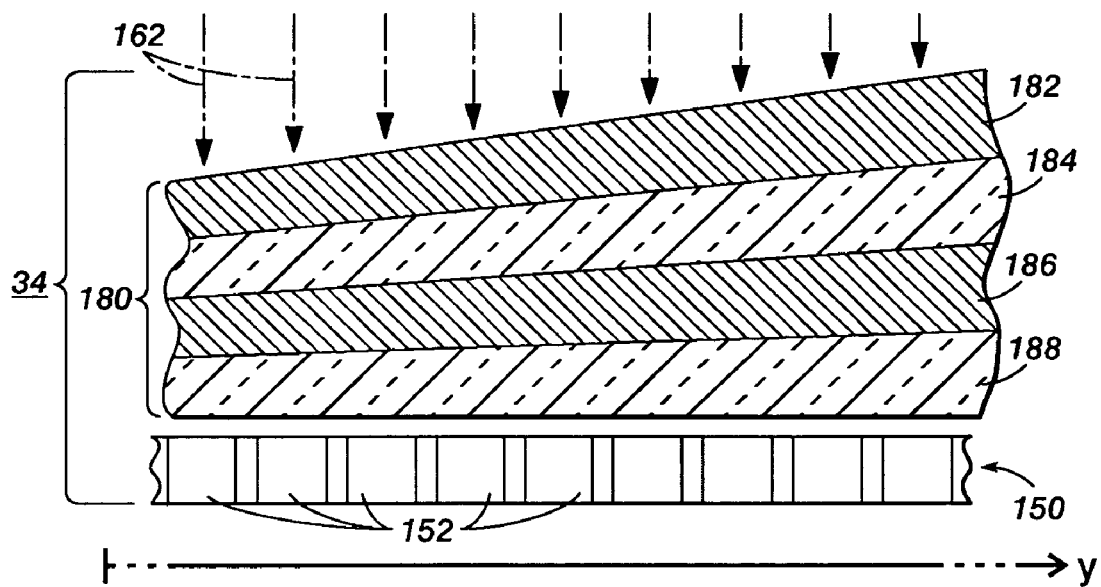
FIG. 6 is a schematic cross-sectional view of another implementation of an assembly that can be used in FIG. 1.

FIG. 6 illustrates another implementation of assembly 34, with features that have the same reference numbers as in FIG. 4 being implemented as described above. Rather than transmission structure 160, however, assembly 34 includes transmission structure 180. Transmission structure 180 can, for example, be a laterally graded Bragg mirror in which each of layers 182, 184, 186, and 188 is laterally graded. Each of layers 182, 184, 186, and 188 could be produced as described above for cavity 170, using off-axis deposition in an evaporation chamber.

Figure 7:
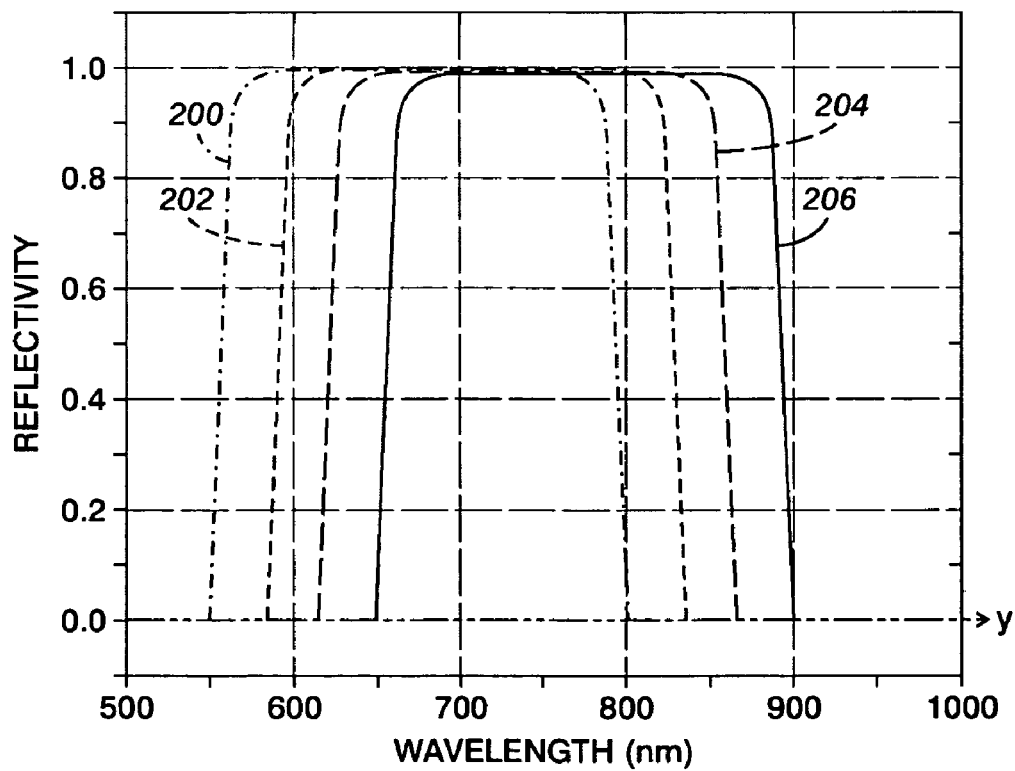
FIG. 7 is a graph illustrating the laterally varying light transmission properties of a transmission structure in FIG. 6.

FIG. 7 illustrates the laterally varying light transmission properties of transmission structure 180. Because its thickness varies as a function of position along the y-axis, transmission structure 180 reflects different wavelengths as a function of position along the y-axis. Curves 200, 202, 204, and 206 are shown, representing reflectivity of the portion of transmission structure 180 over each of four cells 152 in fragment 150, with curve 200 being for the leftmost cell of the four in FIG. 6 and curve 206 being for the rightmost cell of the four. As can be seen, the high-reflectivity photon energy range for transmission structure 180 varies laterally.

Figure 8:
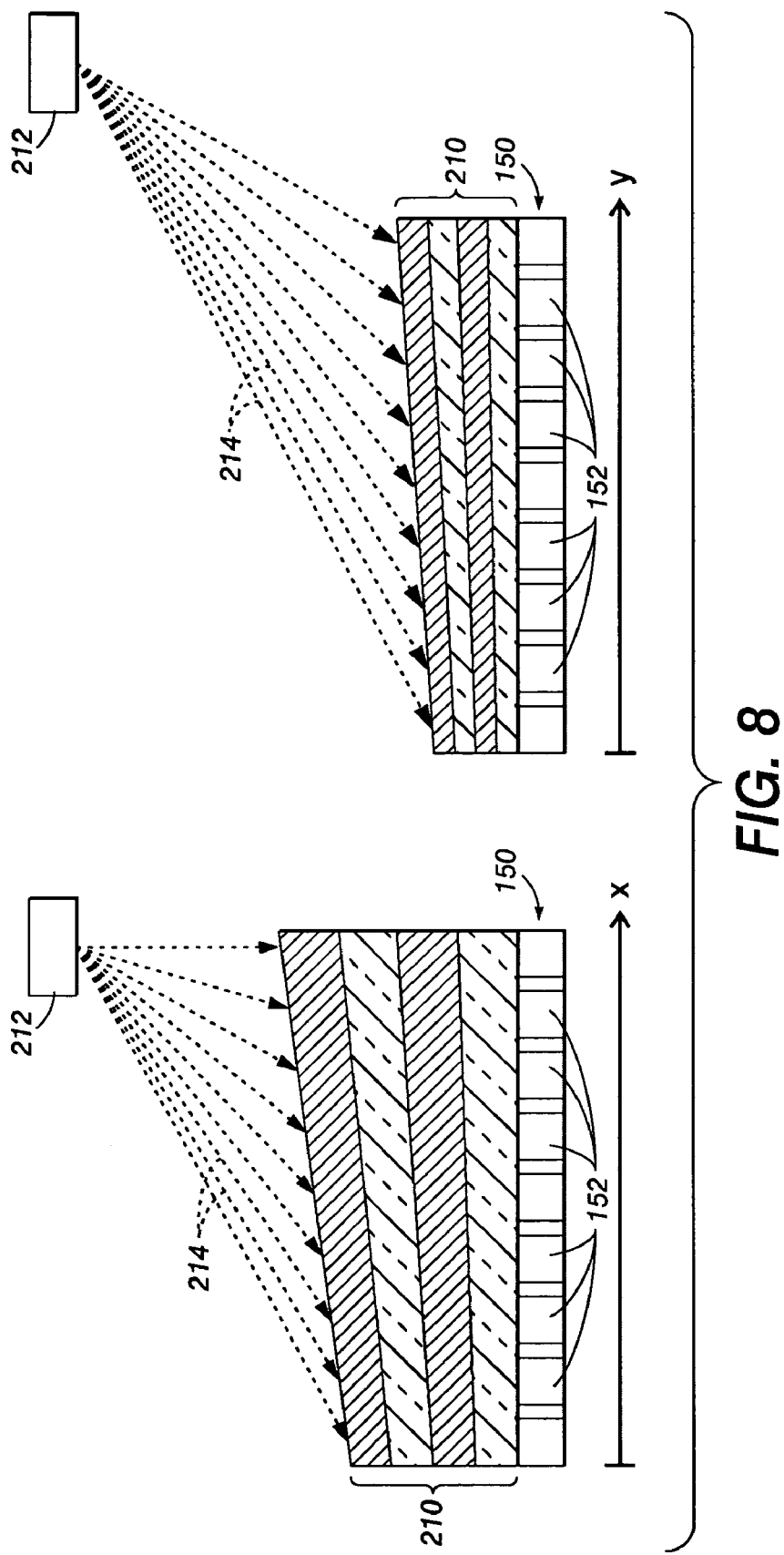
FIG. 8 illustrates a technique that produces a transmission structure that can be used in an assembly as in FIG. 1, showing orthogonal schematic cross-sectional views of deposition.

FIG. 8 illustrates a technique that produces transmission structure 210 with laterally varying light transmission properties similar to those illustrated in FIGS. 5 and 7 but with lateral variation in each of two dimensions. This technique can be used to produce different coatings for different rows of a photosensor array so that their cells photosense different ranges or subranges of photon energies, and can be used separately or in combination with reference cells.

Transmission structure 210 is produced on or over cells 152 of photosensor array 150 by using deposition source 212 to provide deposition beam 214 that can be characterized at any given point on the surface of structure 210 by two angles. One of the two angles results from angular variation of deposition beam 214 in the x-direction across array 150, while the other results from angular variation in the y-direction. As a result, the thickness gradient of structure 210 is similarly different in the x- and y-directions. Therefore, cells within each row extending in the y-direction will photosense a range of photon energies similarly to FIG. 7, but the range will be different than the range photosensed by cells in any other row extending in the same direction.

The technique of FIG. 8 could be implemented in a variety of ways. For example, during deposition, structure 210 could be formed on a support structure that is tilted as required, deposition source 212 could be tilted as required, or both kinds of tilt could be employed.

Figure 9:
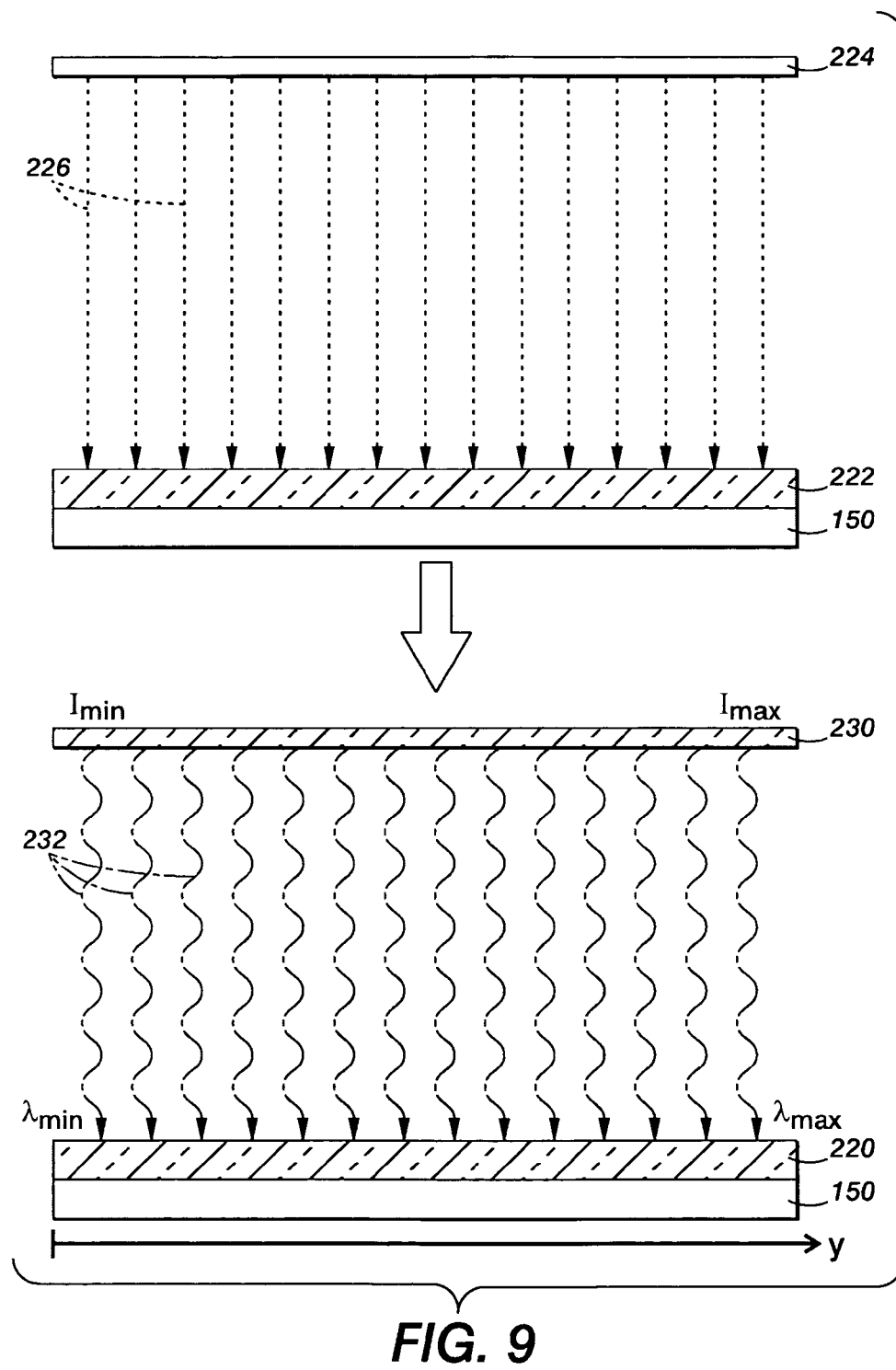
FIG. 9 illustrates another technique for producing a transmission structure that can be used in an assembly as in FIG. 1, showing two schematic cross-sectional views of stages of the technique.

FIG. 9 illustrates a technique that produces transmission structure 220 with laterally varying light transmission properties similar to those illustrated in FIGS. 5 and 7 but without variation in thickness of transmission structure 220. The technique in FIG. 9 can be characterized as providing laterally varying optical thickness d*n, where d is thickness and n is index of refraction, but without actual variation in thickness d. In contrast, the techniques of FIGS. 4-8 provide varying optical thickness by providing actual variation in thickness.

In the upper part of FIG. 9, homogeneous coating 222 is deposited by deposition source 224, which provides deposition beam 226 uniformly over the surface of photosensor array 150 similar to those in FIGS. 4, 6, and 8. This operation could, for example, be implemented with conventional deposition techniques.

Then, in the lower part of FIG. 9, light source 230 is scanned across the coating over array 150 to introduce a laterally varying change of refractive index in resulting transmission structure 220. For example, source 230 can be an ultraviolet source that provides intensity I with a constant value along each line parallel to the x-axis (perpendicular to the plane of FIG. 9), but varying from $I_{min}$ for lines nearer the x-axis to $I_{max}$ for lines farther from the x-axis, as shown in FIG. 9 by the values along the y-axis. As a result, the wavelengths transmitted to cells in array 150 can vary along the y-axis from $\lambda_{min}$ to $\lambda_{max}$, as shown. The same pattern of intensity can be concurrently applied by source 230 to each of a number of arrays that are appropriately arranged, allowing batch fabrication of arrays. Two-dimensional variation in optical density equivalent to that in FIG. 8 could also be obtained with two-dimensional variation in the ultraviolet source's intensity.

Figure 10:
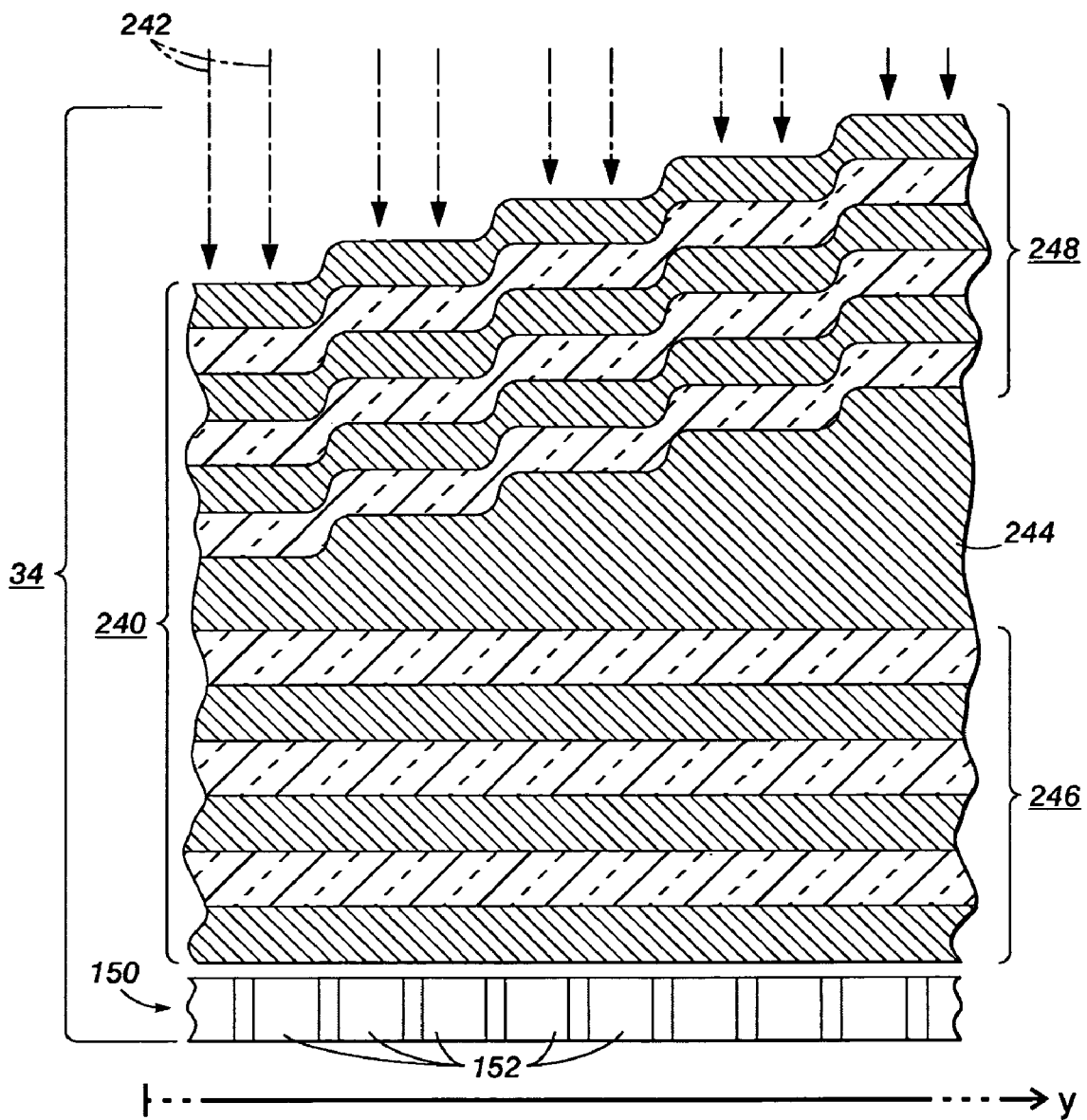
FIG. 10 is a schematic cross-sectional view of another implementation of an assembly that can be used in FIG. 1.

FIG. 10 illustrates an implementation of assembly 34 that is similar to the implementation of FIG. 4, but with a step-like gradient in the y-direction which could be combined with a constant thickness in the x-direction or with a constant gradient in the x-direction as in the left-hand side of FIG. 8. The arrangement in FIG. 10 can be used with a photosensor array that has discrete photosensing cells, as illustrated by fragment 150 with cells 152. If used with a CCD or CMOS photosensor array, cells under different steps will receive photons in different energy subranges of the range of photon energies incident upon assembly 34.

In FIG. 10, in addition to the cross section through fragment 150, a cross section has been taken through transmission structure 240 that receives incident light 242, such as from any of the below-described implementations for receiving light from a light source. Similarly to transmission structure 160 in FIG. 4, transmission structure 240 includes staircase-shaped transmission cavity 244 enclosed between reflective films 246 and 248, forming a staircase-shaped Fabry-Perot etalon. Because its thickness varies as a function of position along the y-axis, transmission structure 240 will transmit different wavelengths as a function of position along the y-axis.

Figure 11:
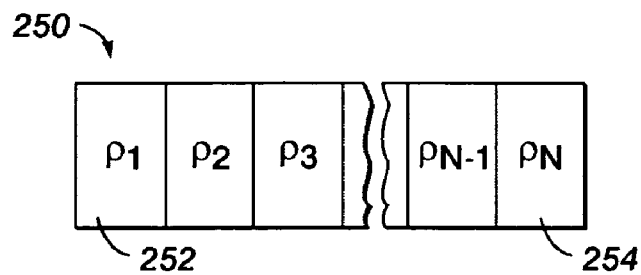
FIG. 11 is a schematic top view of a mask that could be used to produce a transmission structure as in FIG. 10.

FIG. 11 illustrates half-tone mask 250 that can be used in producing transmission structure 240. For example, the technique in FIG. 9 could be modified by interposing mask 250 between deposition source 224 and array 150 while depositing cavity 244 so that, rather than being homogeneous in thickness, coating 222 would have a step-like shape like structure 240 in FIG. 10. As shown, mask 250 includes a series of N rectangular regions 252 through 254, each of which has holes large enough that material from deposition beam 226 can easily pass through. The density of the holes increases, however, from $\rho_1$ to $\rho_N$, so that the thickness of cavity 244 also increases, and cavity 244 is thinnest under region 252, becomes thicker under each successive region, and is thickest under region 254.

This technique can also be applied to achieve a continuous or uniform cavity gradient as depicted in FIG. 4. In this case, the density of holes would increase continuously from $\rho_1$ to $\rho_N$, so that the thickness of cavity 170 also increases gradually, and cavity 170 is thinnest at the left side of structure 160 and thickest and the right side of structure 160.

A transmission structure of uniform thickness but with optical thickness similar to that of transmission structure 240 can alternatively be produced, for example, with a technique similar to that shown in FIG. 9. Rather than a uniformly varying radiation function with a constant gradient, light source 230 can provide a step-like radiation function, either by scanning or by concurrent radiation. Or light source 230 could provide a constant radiation function through a light absorbing structure with a step-like absorption function.

The techniques illustrated in FIGS. 4-11 could be implemented in various other ways, with different cells of a photosensor array or different positions of a position-sensitive detector photosensing slightly different subranges of a range of photon energies. For example, additional details about various production and calibration techniques and characteristics of transmission structures that could be employed are described in U.S. Patent Application Publication No. 2006/0039009, incorporated herein by reference in its entirety.

If quantities photosensed by the cells are read out in parallel and compared, such as in the way suggested in FIG. 2, sensing results that result from or depend on position, light spot position information, other position information, wavelength shift information, and other information about incident photons can be obtained. As illustrated in FIG. 3, nearby cells, such as in a parallel row, can photosense quantities of photons throughout the range of photon energies to provide reference information. If adjacent cells in the array have overlapping subranges, computational techniques such as deconvolution can be used to improve accuracy.

In general, the resolution of a technique as in any of FIGS. 4-11 depends heavily on the number of cells in an array, the full width half maximum (FWHM) of the transmission peak, and the peak shift per cell. The smaller the FWHM and the peak shift, the better the resolution. On the other hand, the totally covered spectral width can be enhanced by increasing the FWHM and the peak shift per cell. Therefore, the technique can be customized to the needs of a specific application. For example, the use of a Fabry-Perot cavity as in FIG. 4 enables very high spectral resolution, while a version with multiple cavities and many layers as in commercially available products will be favorable for applications with low light intensities in combination with small spectral resolution such as with fluorescence. With such an approach, the spectral width of the transmission window and the reflectivity of the stop band can be optimized separately, which may be advantageous because the reflectivity of the stop band determines stray light suppression.

A particular advantage of photon energy monitoring as in FIGS. 1 and 2, when implemented with techniques similar to those of FIGS. 3-11, is that laterally varying transmission and reflection properties of the coating over the photosensor array define a correlation between position and photon energy. Therefore, sensing results can depend on position and a spatially dependent signal from the photosensor array can contain information about photon energy.

In experimental implementations, a coating as in FIG. 4 typically transmits approximately 60% of photons in its respective subrange. The subranges can be chosen with wavelengths that span between 0.01 and tens of nanometers (nm), depending on the design and gradient of the coating and the cell size of the photosensor array. Very high light yield can be achieved by using a highly sensitive photosensor, such as an avalanche photosensor array.

In contrast to transmission structures 160, 180, 210, 220, and 240, any coating or other transmission structure over row 102 in FIG. 3 must operate as a gray filter across the range $\lambda_{all}$ in order to provide a suitable reference. It may also be possible to leave row 102 uncoated in some implementations.

Techniques involving photon energy monitoring by photosensing in subranges, as exemplified by the implementations in FIGS. 1-11, can be implemented in many different ways for a wide variety of applications. For example, photons incident on assembly 34 with a homogeneous or inhomogeneous photon energy distribution could be obtained in many different ways, some of which are described below.

FIGS. 12-16 illustrate examples of how light from a light source can be provided to an assembly such as assembly 34 as described above. Some of the examples include spreading components, as explained in greater detail below. In addition to the steepness of a coating gradient and the length of a photosensor array, light beam geometry plays an important role in resolution of photon energies, also referred to as "wavelength resolution." For optimal performance, the light beam would be perfectly parallel, as could be produced with an appropriate lens system. For many applications, however, absolute wavelength resolution is not very critical, and the optical components are not as important.

Figure 12:
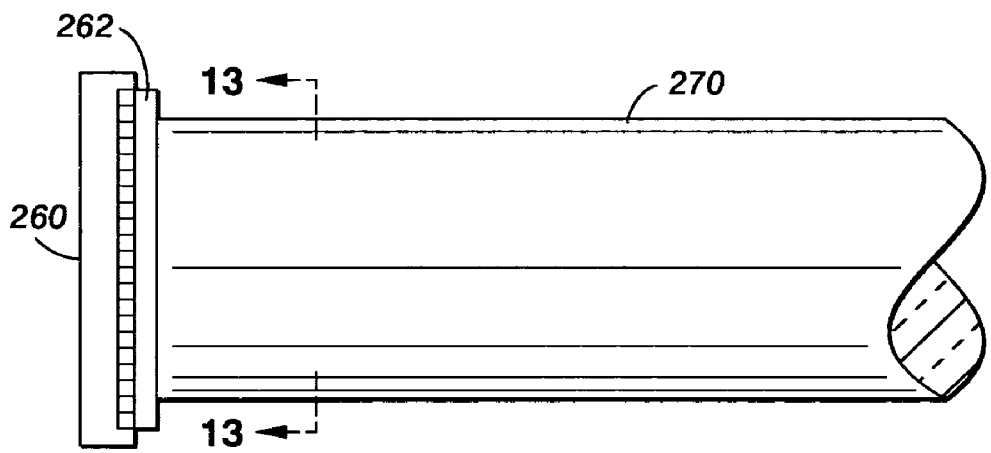
FIG. 12 is a schematic side view of an implementation of components of a system as in FIG. 1.
Figure 13:
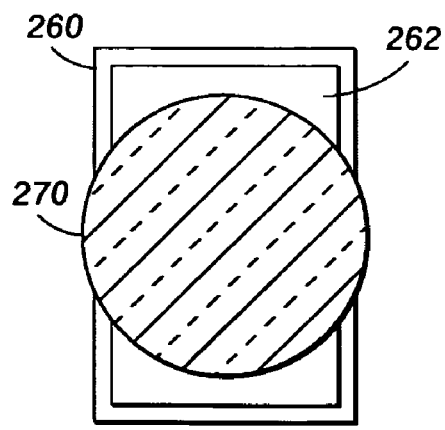
FIG. 13 is a cross-sectional view of the implementation of FIG. 12, taken along the line 13-13.

In FIG. 12, photosensor array 260 is covered by coating 262, a laterally varying transmission structure implemented in any of the ways described above. Fiber 270 provides the light from a laser or other light source of any of the types described above, and could alternatively be any other type of broad area light source, whether homogeneous or inhomogeneous; if inhomogeneous, quantities photosensed by reference cells can be used to adjust quantities photosensed by subrange cells, as mentioned above in relation to the reference cells in FIG. 3. In any case, fiber 270 is positioned as close as possible to the surface of coating 262. As shown by the cross-sectional view in FIG. 13, fiber 270 can have approximately the same cross-sectional area as the area of array 260, so that light from fiber 270 can be spreaded across approximately the entire surface of coating 262. This configuration provides cheap and simple alignment, but is not suitable for high wavelength resolution. Fiber 270 could be any appropriate fiber, such as a glass or polymer optical fiber. In this configuration, spreading of light occurs at the interface between fiber 270 and coating 262, because the surface of fiber 270 disposed toward coating 262 operates as a spreading component.

Figure 14:
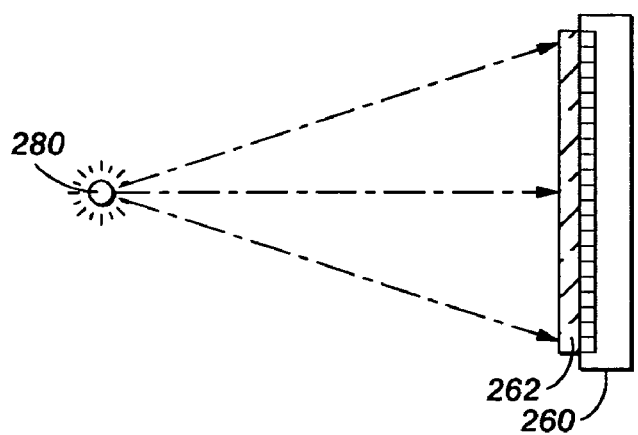
FIG. 14 is a schematic side view of another implementation of components of a system as in FIG. 1.

In FIG. 14, light source 280 is a divergent source such as an LED or an optical fiber that provides a divergent light beam and is positioned a sufficient distance from coating 262 to illuminate the entire sensing area of photosensor array 260. As in the implementation of FIGS. 12 and 13, this implementation allows cheap and simple alignment, but is not suitable for high wavelength resolution. In this configuration, spreading of light occurs in the distance or gap between source 280 and coating 262, because air, gas, a transparent medium, or vacuum in the gap operates as a spreading component.

In one successful implementation similar to FIG. 14, light from a semiconductor laser was propagated through an optical fiber with its exit surface separated from coating 262 by an air gap. To prevent problems with interference and feedback, a single-mode fiber was used rather than a multi-mode fiber; other optical components such as diffusers, optical isolators, and collimation lenses might also be used in configurations that avoid interference and feedback problems. In the actual successful setup, a conventional position adjustment device was used, allowing adjustment of the size of the air gap to obtain an optimum distance between the exit surface of the optical fiber and the entry surface of coating 262. Once the optimum gap size is determined, however, a similar device could be constructed with a fixed mechanical component that would maintain the desired distance.

Even though the divergence of light from the exit surface of the optical fiber, illustrated in FIG. 14, results in some inhomogeneity due to different angles of incidence, this (and other types of inhomogeneity) can be corrected using photosensed quantities from reference cells, as described above in relation to FIG. 3, provided the ratio between the minimum and maximum intensities is not so great that it precludes correction. As discussed below in relation to FIG. 17, this inhomogeneity can alternatively be employed to obtain a desired distribution of light.

One advantage of the single-mode fiber technique described above is that the single-mode fiber decouples a laser or other highly coherent light source from reflection that occurs from coating 262 or from other components of the light sensing assembly, reflection that could make the light source unstable due to feedback. This would also be a problem if the light source were directly in front of coating 262, but could be avoided by other optical isolation techniques that could be used together with or in place of a single-mode fiber, such as to obtain a more compact structure. Other optical isolation techniques might be advantageous in alignment-sensitive implementations, such as where light source 280 and the light sensing assembly are integrated in a single structure. In general, techniques that can be used to avoid feedback with laser intensity monitoring can also be used in configurations for photon energy monitoring. In other variations, it may be advantageous to scatter light from a highly coherent source such as a laser, such as by scattering from a center onto a light sensing assembly.

Figure 15:
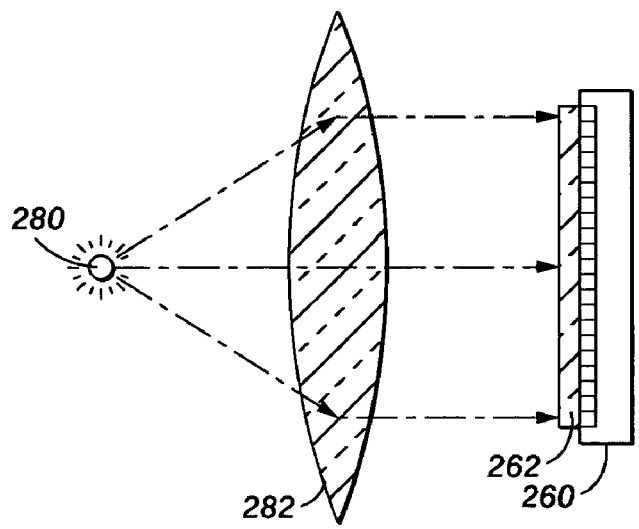
FIG. 15 is a schematic side view of another implementation of components of a system as in FIG. 1.

In FIG. 15, lens 282 is positioned between light source 280 and coating 262, making the divergent beam from source 280 parallel. This configuration also allows for a simple alignment, and, in addition, makes it possible to obtain high wavelength resolution. In this configuration, spreading of light occurs in the distance or gap between source 280 and lens 282, because air, gas, a transparent medium, or vacuum in the gap operates as a spreading component, producing a more suitable light distribution on coating 262. The above-described single-mode fiber implementations could be modified to include such a lens between the fiber's exit surface and coating 262. In an alternative implementation, lens 282 actually images a broad area light source (e.g. a fiber end facet) onto coating 262.

Figure 16:
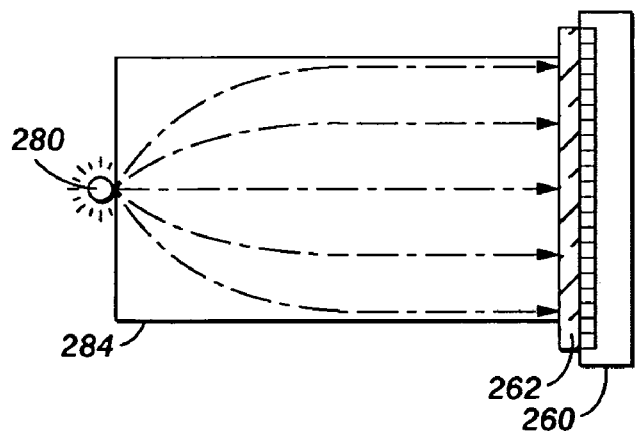
FIG. 16 is a schematic side view of another implementation of components of a system as in FIG. 1.

In FIG. 16, optical component 284 is positioned between point-like light source 280 and coating 262, and can be a SELFOC® or gradient index (GRIN) lens that makes the divergent beam from source 280 parallel. This configuration has the same advantages as that of FIG. 15, but the sizes of lenses that can be used in this configuration are limited to those that are available. Additionally, this configuration enables more robust implementations in which all components are attached to each other; this is possible, for example, using a commercially available GRIN lens with its focal point right at its surface. In this configuration, spreading of light occurs within lens 284 near source 280, because that region of lens 284 operates as a spreading component. As above, a more suitable light distribution is produced on coating 262. Here again, the above-described single-mode fiber implementations could be modified to include a lens like lens 284, appropriately positioned.

Figure 17:
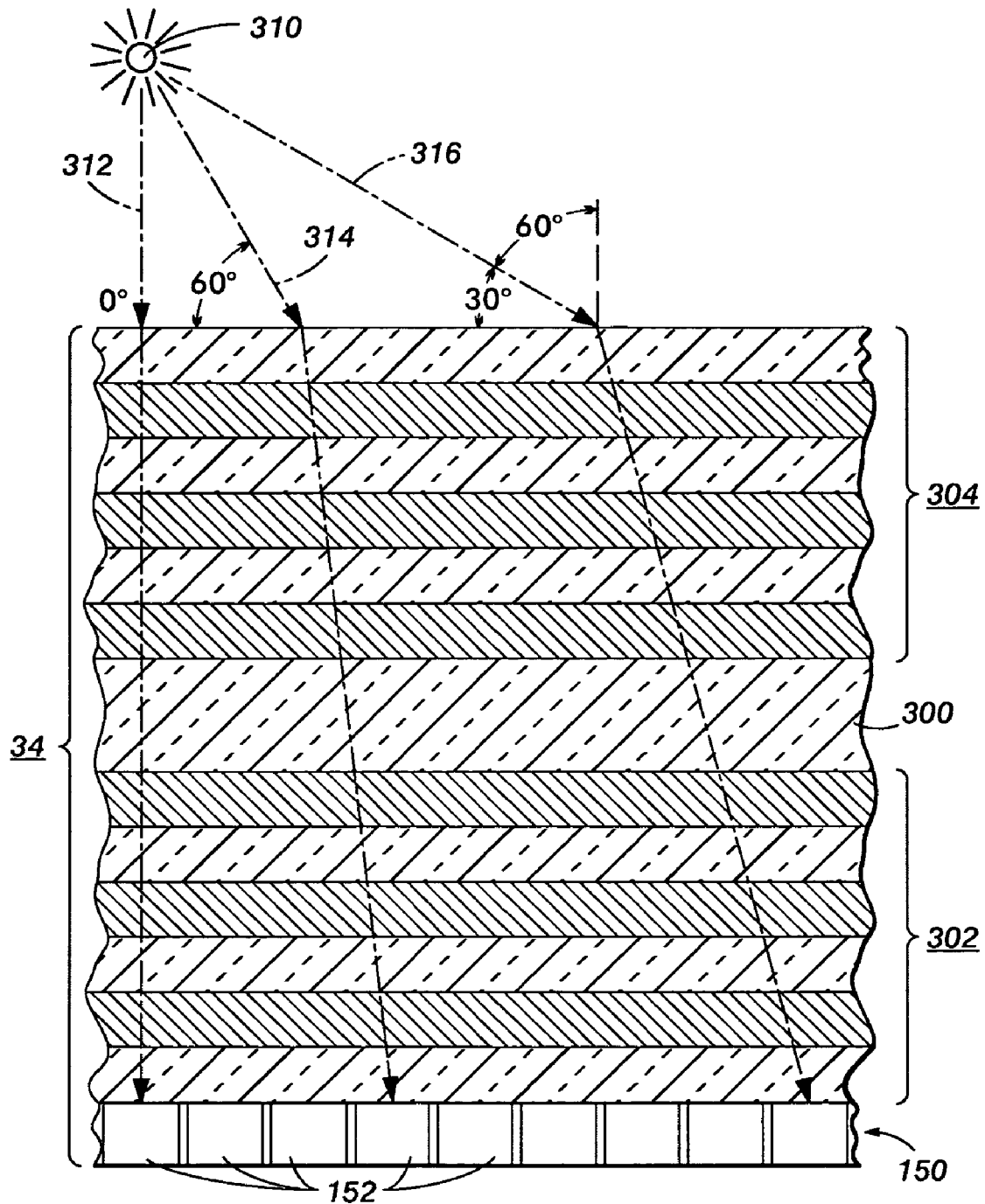
FIG. 17 is a schematic cross-sectional view of another implementation of an assembly that can be used in FIG. 1.

As noted above, divergence from a light source as in FIGS. 14-16 introduced inhomogeneity. FIG. 17 illustrates an example of an alternative configuration in which a source of inhomogeneity, difference between angles of incidence due to divergence, is used to produce a laterally varying photon energy distribution with a homogeneous transmission structure rather than a laterally varying transmission structure. Photosensor array 150 includes cells that receive incident light from a homogeneous Fabry-Perot cavity 300 between DBR mirrors 302 and 304. Cavity 300 and mirrors 302 and 304 could be produced as described above in relation, e.g., to FIG. 4, but without lateral variation in transmission characteristics. Cells 152 photosense different subranges because the transmission and reflection properties of mirrors 302 and 304 depend on the angle of incidence of light. In other words, each subrange cell is, in effect, illuminated at a different angle of incidence, so that the characteristics of the transmission structure preceding it differ from that of adjacent cells.

In this example, light source 310 can be a point-like source positioned over assembly 34, similar to light source 280 in FIG. 14. Three exemplary rays are shown in FIG. 17. Ray 312 has an angle of incidence of 0° from the normal and therefore passes straight through the transmission structure to the leftmost subrange cell shown. Ray 314, in contrast, has an angle of incidence of 30° with the normal (i.e. an angle of 60° with the surface as shown), and ray 316 has an angle of 60° with the normal, so that each of these rays follows a longer path through the transmission structure than the path of ray 312. This results in a well-defined wavelength-position function that is defined by the angular distribution. The resulting graph of reflectivity as a function of wavelength would resemble FIG. 5, with photons of a certain energy illuminating only one or a few subrange cells, corresponding to a subrange of angles of incidence. Photosensor array 150 could also include uncoated or gray-filtered reference cells (not shown) to allow correction of inhomogeneity.

Various other techniques could be used to provide light from a light source to an implementation of assembly 34. The techniques described in relation to FIGS. 12-17 are merely illustrative, and could be varied in many ways. For example, various techniques with multiple light sources could be implemented, as described in co-pending U.S. patent application Ser. No. 11/316,241, entitled "Transmitting Light with Photon Energy Information", and incorporated herein by reference in its entirety.

Figure 18:
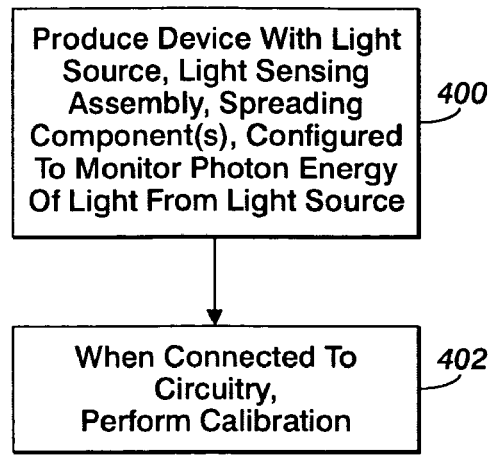
FIG. 18 is a flow chart showing operations performed in producing components of a system as in FIG. 1.

FIG. 18 illustrates exemplary operations in producing a system like system 10 in FIG. 1. In particular, the operations in FIG. 18 make it possible to produce a system that can monitor photon energy of light from a light source.

The operation in box 400 produces a device with a light source, a light sensing assembly, and possibly one or more spreading components, configured so that light from the source is incident on the light sensing assembly, such as in one of the ways described above in relation to FIGS. 12-17. The light source could be any of the types described above, such as a laser, an LED, an SLED, a resonant cavity LED, etc. This operation can be performed in any appropriate way, including mounting discrete components on a support structure, microfabricating an integrated structure that includes the components, or any other appropriate combination of operations that attach or fabricate components so that they are connected.

After the device is produced in box 400, the operation in box 402 performs calibration. As shown, calibration requires that the components be appropriately connected to circuitry, such as in one of the ways described below, but the necessary connections could be created as part of the operation in box 400 or instead could be created after the operation in box 400 and before performing calibration. Alternatively, calibration could be performed with a reference light source, prior to completion of the device in box 400, such as using one of the techniques described in U.S. Patent Application Publication 2006/0039009, incorporated herein by reference. In any case, calibration in box 402 can include obtaining items of data or data structures to be used in monitoring operations, as described below.

Figure 19:
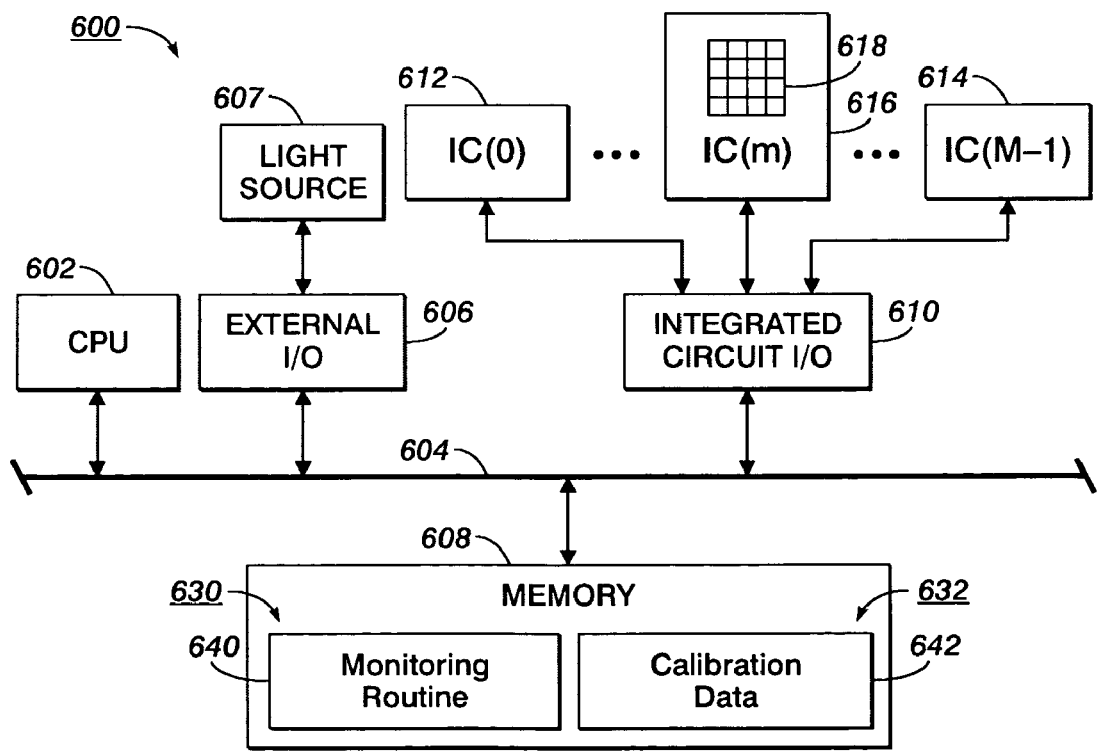
FIG. 19 is a schematic block diagram of circuitry that could be used in a system as in FIG. 1.

FIG. 19 illustrates features of a system that includes one or more devices as in FIG. 1. In FIG. 19, system 600 is an exemplary system that could be used to monitor photon energy of light from a light source as described above. System 600 illustratively includes central processing unit (CPU) 602 connected to various components through bus 604, but a wide variety of other architectures could be employed, including any appropriate combination of hardware and software, as well as specialized hardware components such as application specific integrated circuits (ASICs) for one or more of the illustrated components or in place of a software component executed by CPU 602.

System 600 also includes external input/output (I/O) component 606 and memory 608, both connected to bus 604. External I/O 606 permits CPU 602 to communicate with devices outside of system 600, illustratively including light source 607. For interactive applications, external I/O 606 could be connected to a suitable user interface, such as a monitor and keyboard (not shown). Additional components connected to bus 604 are within or connected to system 600. In the illustrated implementation of system 600, IC I/O 610 is a component that permits CPU 602 to communicate with one or more ICs in sensing assembly 34. M ICs are illustrated by a series from IC(O) 612 to IC(M-1) 614, including IC(m) 616 with a photosensor array 618.

Memory 608 illustratively includes program memory 630 and data memory 632, although instructions for execution by CPU 602 and data accessed during execution of instructions could be provided in any of the ways described above. The routines stored in program memory 630 illustratively include monitoring routine 640. In addition, program memory 630 could store various additional subroutines (not shown) that CPU 602 could call in executing routine 640. Similarly, the data in data memory 632 illustratively include calibration data 642, but could include various additional items of data and data structures accessed by CPU 602.

In executing routine 640, CPU 602 can provide signals to activate light source 607 and then can provide signals to each of ICs 612 through 614 to read out subrange cells and to use the photosensed quantities to perform photon energy monitoring. In performing monitoring, routine 640 can also optionally read out reference cells and use their photosensed quantities to adjust photosensed quantities from subrange cells, such as with techniques described in co-pending U.S. patent application Ser. No. 11/316,438, entitled "Photosensing Throughout Energy Range and in Subranges" and incorporated herein by reference. In an implementation with a position-sensitive detector, as described below, CPU 602 could instead provide whatever signals are necessary to obtain photosensed quantities; for example, CPU 602 could control circuitry to connect output currents from the position-sensitive detector to a differential amplifier.

Figure 20:
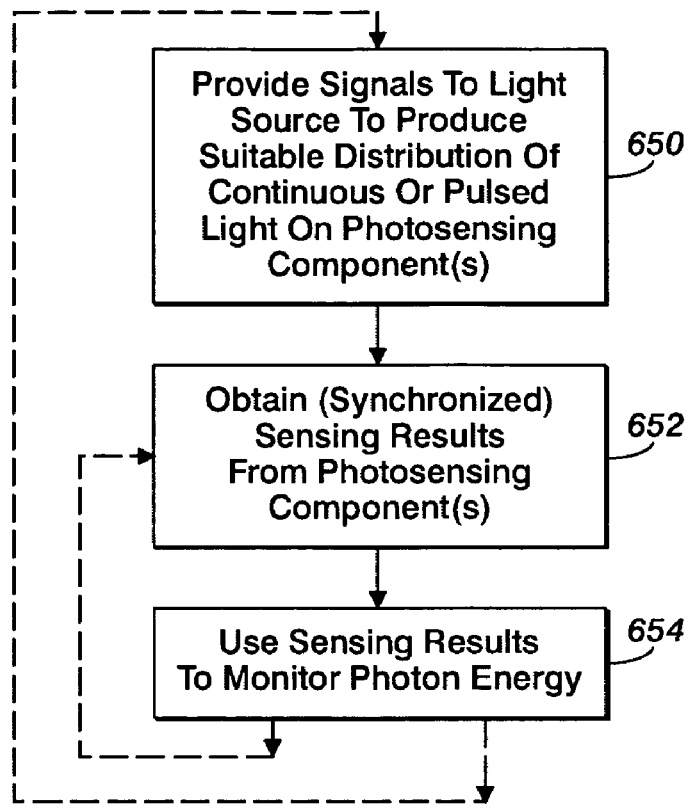
FIG. 20 is a flowchart showing operations that can be performed by a monitoring routine as in FIG. 19.

FIG. 20 illustrates one example of how monitoring routine 640 could be implemented. In box 650, the execution of monitoring routine 640 causes CPU 602 to provide signals to light source 607 through external I/O 606, causing light source 607 to produce a suitable distribution of continuous or pulsed light on one or more photosensing components, such as ICs 612 through 614. Then, in box 652, execution of routine 640 causes CPU to obtain sensing results from the photosensing components, such as via integrated circuit I/O 610 from ICs 612 through 614; the sensing results can depend on position in any of the ways described above, and can also be obtained during sensing periods synchronized with pulses of light from light source 607 as described below. Then, in box 654, execution of routine 640 causes CPU 602 to use the sensing results from box 652 to monitor photon energy.

Figure 21:
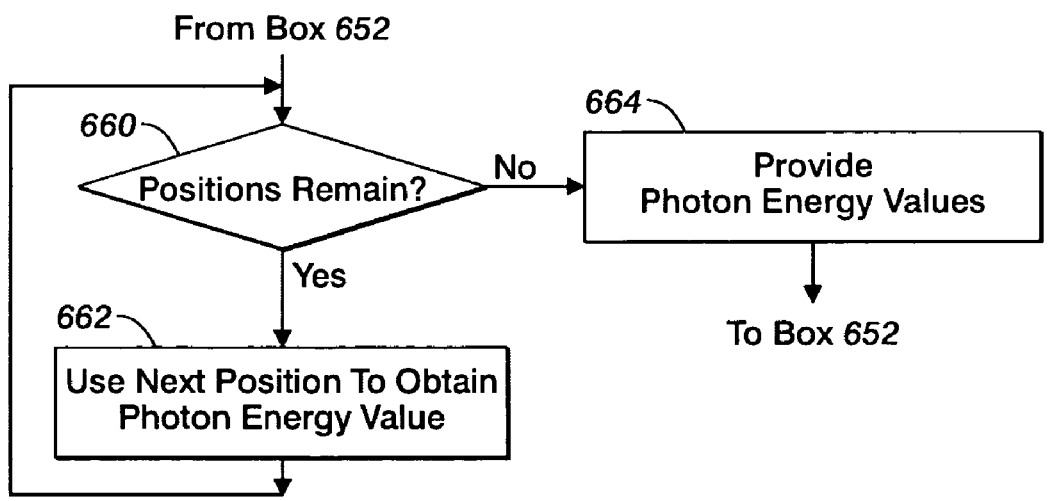
FIG. 21 is a flowchart showing operations that can be performed in monitoring photon energy in FIG. 20.
Figures 22, 23:
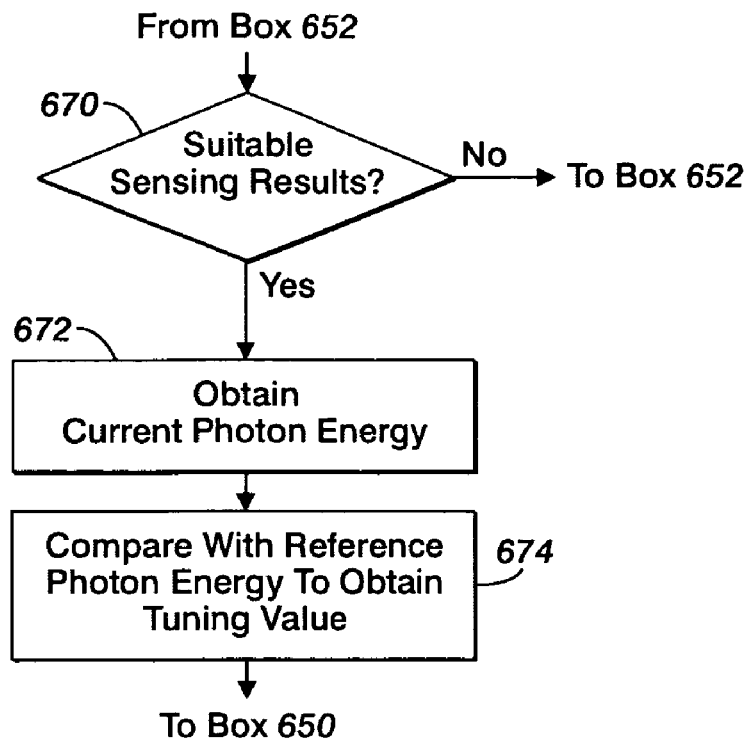
FIG. 22 is a flowchart showing another combination of operations that can be performed in monitoring photon energy in FIG. 20.
FIG. 23 is a flowchart showing another combination of operations that can be performed in monitoring photon energy in FIG. 20.

Routine 640 can perform monitoring in box 654 in many ways, depending on the purpose of monitoring. FIGS. 21-23 illustrate three examples, but are merely illustrative of the many different ways in which monitoring in box 654 could be implemented.

In FIG. 21, the operation in box 660 begins an iterative loop that goes through each of the positions indicated by the position information from box 652. In box 662, each iteration of the loop uses the next position to obtain a photon energy value such as a wavelength. After all the photon energy values have been obtained, the operation in box 664 provides the photon energy values, such as to an appropriate output device through external I/O 606 or for storage in data memory 632; alternatively, each photon energy value could be provided as soon as it is obtained in box 662. After all the photon energy values have been provided, the subroutine illustrated in FIG. 21 can proceed back to box 652, as indicated by a dashed line from box 654 to box 652 in FIG. 20; further position information can be obtained and again used to obtain photon energy values. The type of monitoring illustrated in FIG. 21 is especially appropriate where the purpose of monitoring is simply to sense, detect, measure, or determine photon energy from a light source.

The operation in box 662 in FIG. 21 can be implemented, for example, by accessing calibration data 642 in data memory 632. Calibration data 642 can have any appropriate form, including one or more tables, other data structures, or items of data or, where values obtained during calibration are fitted to a curve, a number of values or other items of data that can be used to compute a relationship on the curve. Also, operations similar to those in FIGS. 20 and 21 can be performed during calibration, but with the signals in box 650 causing a tunable light source to provide light in a selected subrange and with the operations in boxes 662 and 664 being modified to obtain and store calibration data 642. After calibration, the operation in box 662 can then use the stored calibration data 642 to obtain photon energy values.

The subroutine illustrated in FIG. 22, in contrast, is applicable where the purpose of monitoring is to control, tune, select, or lock a light source's photon energy. In box 670, an operation is performed to determine whether sensing results from box 652 are suitable for monitoring of this type. If not, the subroutine in FIG. 22 returns to box 652 to obtain further sensing results, again following the dashed line from box 654 to box 652. But if the sensing results are suitable for this type of monitoring, the operation in box 672 uses the sensing results to obtain a value indicating the current photon energy. Then, the operation in box 674 compares the current photon energy value from box 674 to a reference photon energy value obtained during calibration to obtain a tuning value; the tuning value indicates signals that can be provided to light source 607 in order to return its output photon energy to the reference photon energy. Therefore, from box 674, the subroutine returns to box 650 to provide signals to light source 607 in accordance with the tuning value, following the dashed line from box 654 to box 650 in FIG. 20.

The subroutine illustrated in FIG. 23 provides an alternative to the technique of FIG. 22, an alternative that allows for implementations without calibration and without absolute measurement. Similarly to FIG. 22, the operation in box 680 determines whether sensing results from box 64 are suitable for monitoring of this type; if not, the subroutine returns to box 652, as in FIG. 22. But if the sensing results are suitable, the operation in box 682 then determines whether the sensing results indicate a change of position compared to an earlier reading, which is a type of relative measurement. This operation can also include obtaining additional information about the position change, such as magnitude and direction although detailed information about magnitude may not be possible without calibration. If there has been no change in position, the subroutine in FIG. 23 returns to box 652 to obtain further sensing results. But if a position change is detected, the operation in box 684 uses information about the change of position to obtain an appropriate tuning value indicating what signals must be provided to light source 607 to reverse the change of position. As in FIG. 22, the subroutine then returns to box 650 to provide signals to light source 607 in accordance with the tuning value.

The subroutine of FIG. 23 therefore illustrates an example by which a light spot could be held in position by relative measurement and control rather than by absolute measurement. While FIGS. 22 and 23 both illustrate photon energy control techniques, which could be referred to as "active wavelength control", the technique of FIG. 23 may be advantageous where calibration is impossible or not feasible, because it can be performed to maintain a stable position without calibration data. A similar technique for detecting wavelength shift has been successfully implemented using the single-mode fiber implementation described above. Although precise wavelength shift measurement might be necessary to obtain a tuning value that will immediately correct photon energy (and therefore position), it would be straightforward to provide an implementation in which a change of position detected in box 682 results in an incremental modification of photon energy in box 650 to return the position toward a set point. This latter approach could use conventional control techniques to provide a series of small incremental corrections rather than an immediate complete correction.

For implementations in which a light source provides pulses, such as a pulsed laser used in a sensitive application, the techniques in FIGS. 20-23 could be modified to ensure that appropriate sensing results are obtained, such as by synchronizing photosensing operations with light pulses. For example, the operation in box 650 could be performed once to initiate a pulse or a series of pulses and the operations in boxes 652 and 654 could be performed an appropriate number of times for each pulse in order to obtain sensing results that can be used to obtain absolute or relative photon energy information as needed for the specific application.

In a more specific implementation, CPU 602 and other components of system 600 could operate as monitor circuitry, providing signals to light source 607 and to ICs 612 through 614 and receiving signals from ICs 612 through 614. One or more "pulse signals" can be provided to light source 607, meaning signals that cause light source 607 to provide light pulses; similarly, "sense signals" can be provided, causing photosensing components such as ICs 612 through 614 to sense light; then, "readout signals" from ICs 612 through 614 can indicate sensing results. In response to one or more pulse signals, light source 607 can provide a light pulse during an "emission period", meaning the period during which the light pulse is being emitted or otherwise provided; in response to one or more sense signals, each photosensing cell, PSD, or other photosensitive surface of ICs 612 through 614 can sense incident photons, during a "sense period" meaning a period during which incident photons, such as from a light pulse, affect sensing results, such as by accumulation of free charge carriers resulting from incident photons or by any other suitable technique.

Figure 24:
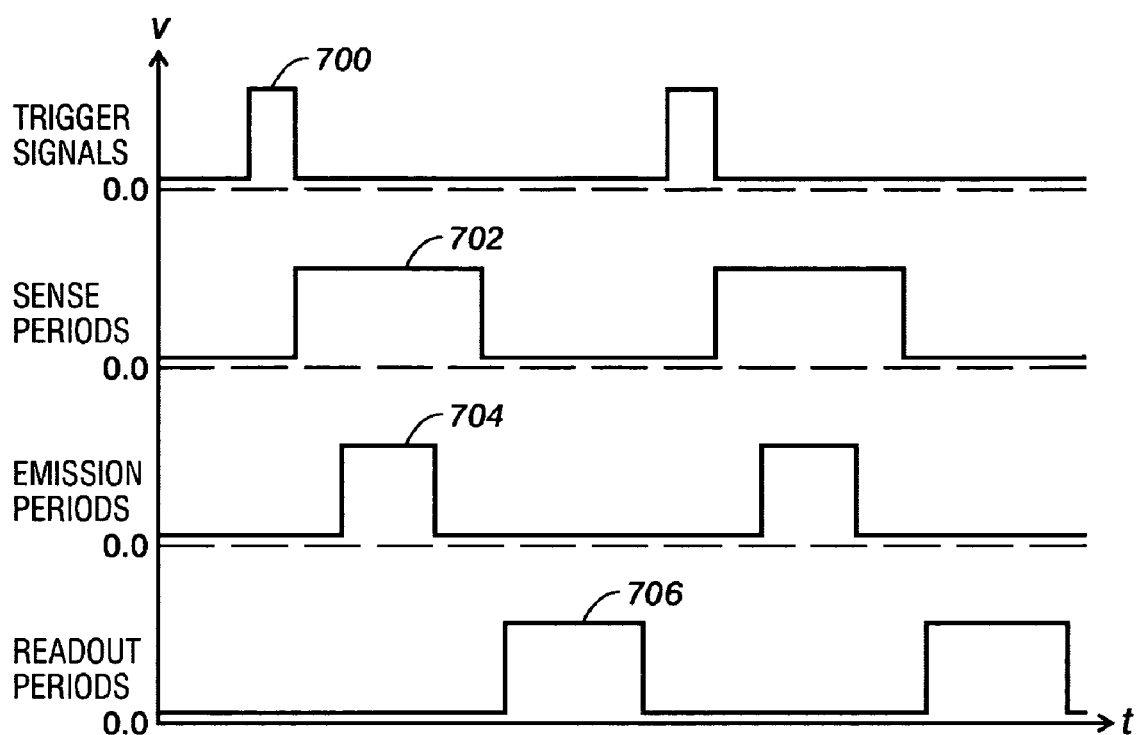
FIG. 24 illustrates a set of timing diagrams that could occur in monitoring photon energy of light pulses as in FIG. 20.

FIG. 24 includes a set of timing diagrams that together illustrate an example in which pulse signals and sense signals are both provided, together synchronizing the emission period and sense period of each light pulse in a series. Waveform 700 includes a series of external trigger signals that can be provided by monitor circuitry as described above, and that can be provided in parallel as pulse signals to a light source and sense signals to a photosensing component, possibly with different delays. In response to each sense signal, the photosensing component initiates a sense period during which incident light is photosensed, as shown by waveform 702; for example, free charge carriers generated by incident light could be accumulated during each sense period. In response to each pulse signal, the light source initiates an emission period, as shown by waveform 704, with each emission period beginning after but ending before the counterpart sense period. After the sense period, readout is performed during a readout period before the next external trigger signal is provided, as shown by waveform 706; readout can, for example, include operations such as amplification, analog-to-digital (A/D) conversion, and obtaining a differential quantity, and these and other operations can be performed in any appropriate order to obtain analog or digital differential signals.

Pulse signals and sense signals can be described as "together synchronizing the emission period and sense period" of a light pulse if the light pulse is provided during the emission period in response to the pulse signals and is sensed during the sense period in response to the sense signals and the pulse signals and sense signals are provided in such a way that the sense period begins no later than the emission period begins and ends no earlier than the emission period ends.

Figure 25:
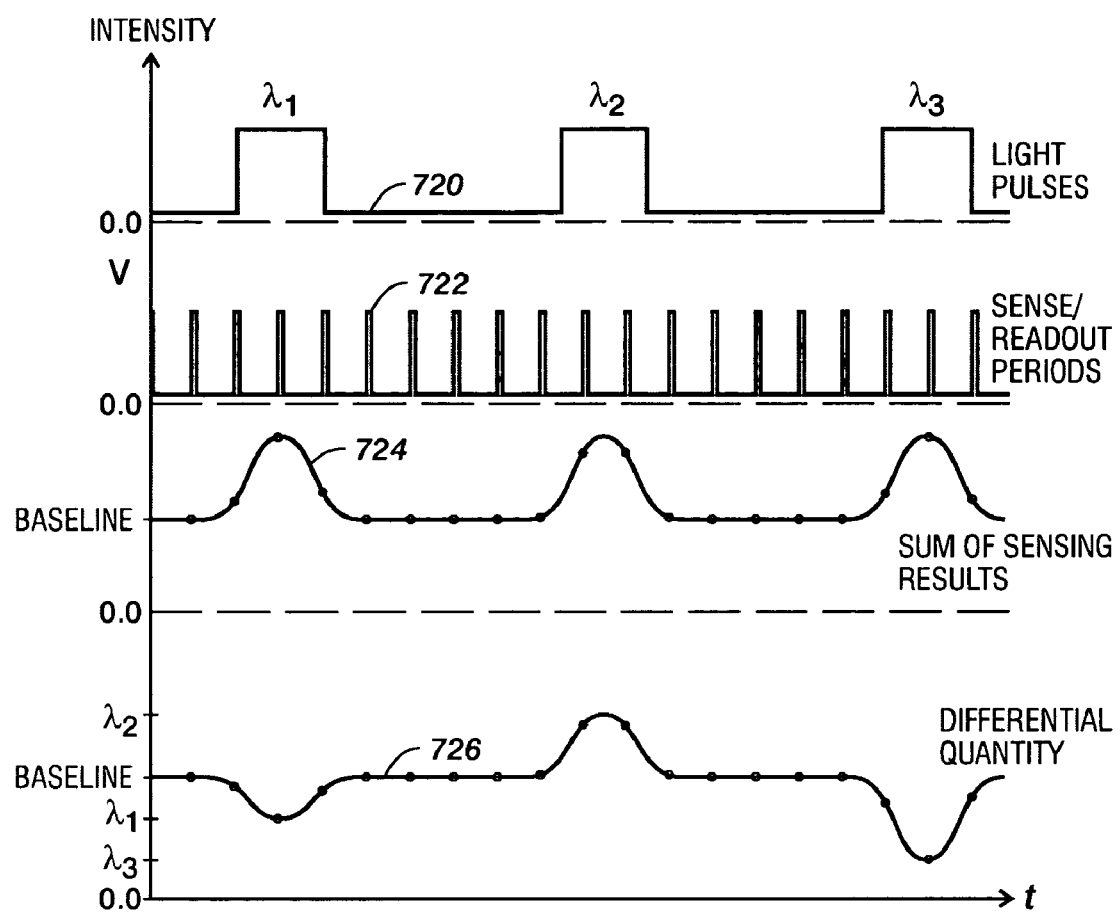
FIG. 25 illustrates another set of timing diagrams that could occur in monitoring photon energy of light pulses, such as with a system as in FIG. 19.

FIG. 25 illustrates another set of timing diagrams that together illustrate an example in which consecutive sense periods are sufficiently close in time that each light pulse's series of sense periods includes at least one sense period that is completed during the light pulse's emission period. Waveform 720 includes a series of light pulses that can, for example, be provided by a laser or other light source during respective emission periods in response to pulse signals (not shown) from the same source or from an independent source. Waveform 722 includes combined sense and readout periods during which photosensing is performed, such as by accumulation of generated free charge carriers; as can be seen, the sense/readout periods are much shorter than the emission periods, as suggested by their impulse-like appearance, and sufficiently close together in time that at least one complete sense/readout period occurs during each light pulse. In case the time period between two consecutive sense/readout periods is shorter than the duration of one combined sense/readout period, an implementation could include multiple readout circuits: For example, a first readout circuit could process sensing results from a first sense/readout period during subsequent sense/readout periods; a second readout circuit could process sense results from a second sense/readout period during subsequent sense/readout periods; and so forth.

Waveforms 724 and 726 illustrate results that could be obtained by reading out and combining sensing results from each of the sense periods in waveform 722, but for the limiting case of high frequency sense periods—a similar waveform could be obtained by using less frequent sense periods as in waveform 722 and by then interpolating or otherwise smoothing the sensing results. Waveforms 724 and 726 could be obtained, for example, by combining sensing results from two cells as in FIG. 2. Waveform 724 could show additive quantities as would result from a sum, product, or other operation indicating the result of adding quantities photosensed by the two cells, while waveform 726 could show differential quantities as defined above. Each waveform has a respective baseline, as indicated on each vertical axis, which can result, for example, from dark currents of the cells; but waveform 724 shows each light pulse with approximately the same amplitude and the same sign relative to the baseline while waveform 726 shows that each light pulse's wavelength has a unique combination of sign and amplitude due to movement of its light spot. As can be seen, waveform 724 can be used to obtain pulse timing information, while waveform 726 can also be used to obtain photon energy information. Also, the two curves could be readily correlated based on their timing, whether obtained in analog form with or without subsequent A/D conversion or in digital form after A/D conversion before or after readout of sensing results.

Timing diagrams like those in FIG. 25 could be obtained with various implementations, including not only photosensing arrays but also PSDs, and with a wide variety of pulse and interpulse durations and sense period frequencies and durations. For example, with laser pulses that are approximately 1 nsec in duration, the frequency of sense periods could be 500 MHz, with each approximately 0.01 nsec in duration. If possible, sensing results from each sense period could be read out before the next sense period, or each sense period could be performed with a respective cell of a photosensing array, and readout of all cells could be performed between light pulses. As can be seen, the interpulse intervals can be several times as long as the emission periods, so that roughly several sense periods could occur during each interpulse interval, and ten or more sense periods per interpulse interval could be typical. For implementations with very fast readout, signal-to-noise issues may affect accuracy due to very short charge accumulation times, but this might be alleviated with parallel sensing circuits.

Figure 26:
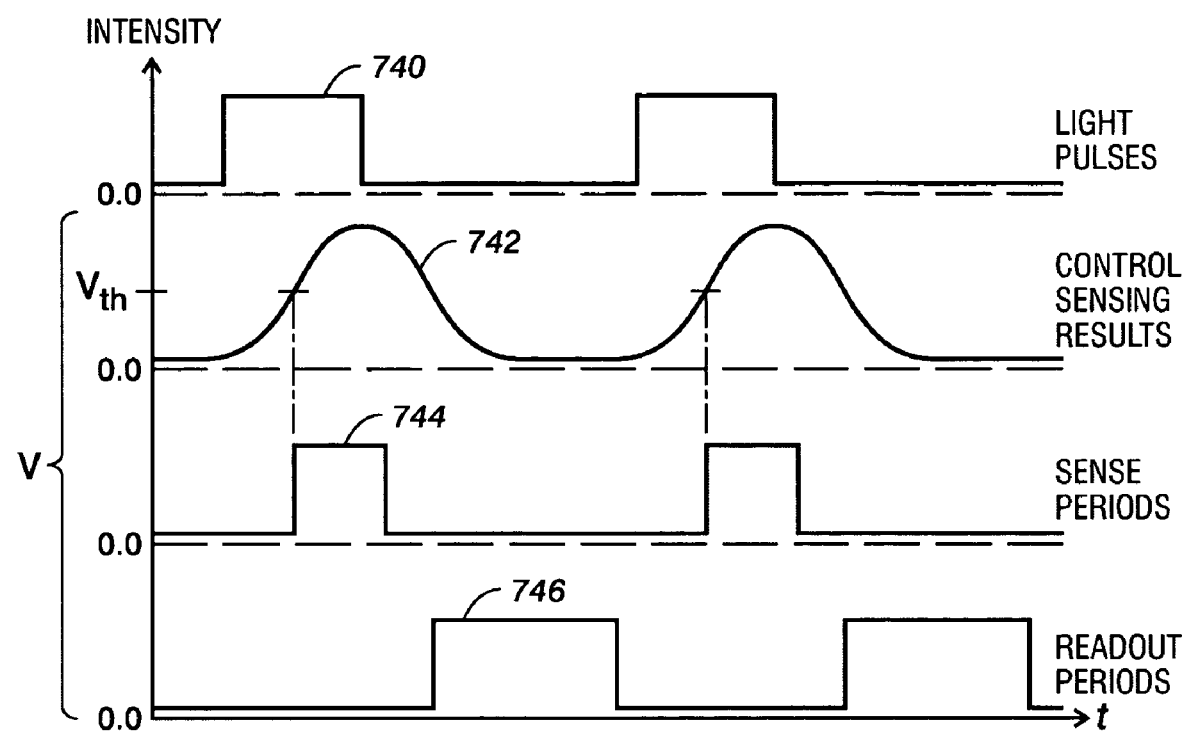
FIG. 26 illustrates another set of timing diagrams that could occur in monitoring photon energy of light pulses, such as with a system as in FIG. 19.

FIG. 26 illustrates another set of timing diagrams that together illustrate an example in which each light pulse in effect triggers its sense period. Waveform 740 includes a series of incident light pulses, generally like those in waveform 730 above. Waveform 742 shows how a transient rising (or falling) voltage could result from each incident light pulse, reaching and then exceeding (or being less than) a threshold voltage. The transient voltage in waveform 742 could be obtained, for example, by dedicating a cell or set of cells on one or more of ICs 612 through 614 (FIG. 19) to function as control sensing circuitry, photosensing each light pulse and, when the resulting threshold as illustrated or other appropriate criterion is satisfied, causing a first sense period in the pulse's series to begin.

In the example in waveform 744 in FIG. 26, each light pulse's series of sense periods includes only one sense period, and it is sufficiently long that the light pulse ends before the sense period ends. After a sense period ends, sensing results are read out during a readout period before the next light pulse is received, as shown in waveform 746.

The technique in FIG. 26 might be modified and implemented in various other ways. For example, each light pulse's series of sense periods could include more than one sense period, similar to the technique in FIG. 25. Also, the first sense period could be caused to begin in any appropriate way, such as by gate- or shutter-like circuitry (not shown) that starts the sense period when threshold is reached or by operating CPU 602 to provide sense signals through IC I/O 610 in response to signals from control sensing circuitry when threshold is reached, Comparison with threshold or application of another criterion could similarly be implemented in any appropriate way, such as with a differential amplifier or other comparator (not shown) that receives a fixed voltage at one lead and the transient voltage due to the light pulse at another lead.

In some implementations of the technique in FIG. 25 and some other techniques, it may be appropriate to perform the operations in box 652 (FIG. 20) at least twice during each pulse in a way that ensures that one complete sense period occurs during each emission period. On the other hand, for typical pulsed laser implementations in which very short light pulses are separated by relatively long interpulse intervals, it may be more feasible for each sense period to include a complete pulse but not much interpulse time, such as with a sense period beginning just before (FIG. 24) or just after (FIG. 26) a light pulse begins and ending just after the light pulse ends so that negligible light is received in the brief parts of the sense period before the pulse begins and after it ends. Sense periods and emission periods of light pulses could be related in various other ways; for example, a sort of averaging over several pulses could be performed by using longer sense periods, though only a few of the differential quantities resulting from such an approach would provide useful information about a single pulse or a series of pulses.

The sensing results obtained for a given pulse can, for example, be used to obtain frequencies for the pulse in accordance with conventional frequency analysis techniques. In particular, sensing results, such as accumulated charge carriers, from a pair of photodiodes or other photosensing cells that receive light in different subranges can be used to obtain differential signals that in turn provide relative wavelength information based on position. The differential signals can be obtained by a differential amplifier (FIG. 2) or other differential readout circuitry and, as explained above, can indicate difference between quantities photosensed by the two cells.

As implied above, sensing results could be obtained in various ways. For example, a current whose magnitude depends on incident light could be integrated over an appropriate sense period in each cell in a photosensor array to obtain an integrated charge value for the cell. Or, if each cell includes a sensing area in which incident light generates free charge carriers such as electrons or holes and also includes circuitry that accumulates the charge carriers, the sense period could begin with an initialization operation and end with a readout operation, such as an operation that obtains a differential output based on accumulated charge carriers. Sensing results could be obtained in various other ways.

The operation in box 652 in FIG. 20 could be implemented in many different ways, including various conventional techniques for detecting light spot positions using specialized photosensing components and circuitry. Examples include the techniques described in U.S. Pat. No. 7,022,966, incorporated herein by reference, and also various commercially available position-sensitive detectors (PSDs) and related components, such as those available from On-Trak Photonics, Inc. of Lake Forest, Calif., or from Hamamatsu Corporation as described at the sales.hamamatsu.com Web site. More generally, however, various differential quantity techniques can be used to obtain various types of position information. In some cases, a differential signal is obtained from one distribution of photon energies, which can be useful, such as to obtain information about a distribution. In other cases, wavelength shift information is obtained, such as between two peak energy values corresponding to two peak intensity positions. These are both examples of position information, because in each case the result is related to one or more photosensing positions.

To obtain a differential quantity from one distribution of photon energies, currents indicating photosensed quantities from a position-sensitive detector or photosensed quantities from two cells or two sets of cells can be compared similarly to the technique illustrated in FIG. 2; with appropriate differential amplifier circuitry on an IC, the operation in box 652 may be able to perform the comparison with especially high resolution by controlling readout from the cells to the differential amplifier, after which the analog comparison result for the two positions can be converted to a digital value for transfer through bus 604 to CPU 602. A differential amplifier can be used for an especially high resolution comparison of intensities of two different position-sensitive detector currents. Rather than a differential amplifier, any other suitable analog component could be used that provides a biased or unbiased analog difference or analog ratio.

To obtain wavelength shift information, a comparison can be performed on photosensed quantities to sense a change in photon output position. For example, when the output from a differential amplifier as in FIG. 2 makes a transition between high and low, the transition indicates a shift of peak energy value (and peak intensity position) between $\lambda_a$ and $\lambda_b$.

Rather than performing analog comparison, as described in the examples above, photosensed quantities could instead be digitized before comparison, in which case the operation in box 652 could perform any appropriate subroutine to obtain a digital differential quantity or any other data indicating a comparison result for two or more positions. Such a subroutine could also include normalizing or otherwise adjusting each digitized value prior to comparison. The subroutine could perform subtraction, division, or any other operation that produces a result indicating the difference between or among photosensed quantities from two or more positions.

Although digital comparison is not likely to be as precise as high resolution analog comparison, it may allow greater flexibility. For example, rather than simply performing pairwise comparison, the operation in box 652 could divide all the non-zero or above-threshold photosensed quantities into two groups in any appropriate way, add the quantities to obtain a summed quantity for each group, and then compare the summed quantities, possibly after weighting for difference in the number in each group. To obtain position information, the groups could be chosen based on position.

More generally, to increase resolution, CPU 602 can compare photosensed quantities with calibration values. The term "calibration value" is used herein to refer to any value obtained by a measurement that either establishes a standard or is based on a previously established standard. A calibration value could, for example, indicate how to categorize, weight, or otherwise interpret, adjust, or correct a given measured value such as a photosensed quantity or photosensed position. Once obtained, a calibration value is typically saved in an appropriate form for subsequent comparison with measured values. Where a calibration value indicates a quantity of photons, it may be referred to as a "calibration quantity".

Absolute wavelength resolution is important to quantify the absolute value of photon energy from a light source, while relative wavelength resolution is important to quantify the change in photon energy from a light source. Both types of resolution may employ calibration to obtain calibration values for later comparison. It should be noted, however, that absolute wavelength calibration can change more easily than relative wavelength calibration as a result of small changes in the setup (e.g. non-collimated light input), so that relative wavelength resolution is more robust.

During calibration, the readout components are illuminated with a known light source and the response is stored in an appropriate calibration data structure. Exemplary calibration techniques are described in Kiesel et al., U.S. Patent Application Publication No. 2006/0039009, incorporated herein by reference in its entirety. As described in Kiesel et al., calibration can be performed with an appropriate reference light source, such as a collimated, single frequency laser source for a high resolution detector or a halogen lamp spectrally filtered by a monochromator for a low resolution detector; various other types of reference light sources could be used in appropriate situations. Because transmission structures of the types described above in relation to FIGS. 4-11 and 17 are stable and do not change significantly over time, calibration performed shortly after fabrication may be sufficient for the operating life of a detector. In cases where environmental conditions such as temperature vary significantly, however, more sophisticated calibration techniques may be appropriate; for example, a detector could include a simple temperature sensor and calibration could be performed across a range of temperatures so that both the position information and temperature information can be used to access calibration values, allowing for temperature dependent calibration.

For absolute wavelength information, a calibration data structure can indicate correspondences between positions and wavelengths; for relative wavelength information, a calibration data structure can indicate correspondences between position differences or relative photosensed quantities, on the one hand, and wavelength, peak value, distribution, or stimulus value differences on the other. Routine 640 can compare quantities it reads out with one or more calibration data structures to obtain either or both of these types of information.

The inhomogeneity resulting from a divergent light source may not be problematic for relative measurement such as wavelength shift detection, provided that the angular distribution of light is stable. In the example in FIG. 17, this will be true if light source 310 provides a stable photon energy distribution across the range of angles at which light can reach array 150. The angular distribution of light will also be stable for configurations like those in FIGS. 14-16 if a similar condition holds. Providing a stable angular distribution is even more important for transmission structures with laterally varying transmission functions as in FIGS. 4-11 because, in those cases, an unstable angular distribution would cause deviation from the expected wavelength-position function. If the angular distribution is stable, a calibration can be performed to correct angle-dependent deviations, and with an appropriate calibration it would be feasible to achieve absolute measurements.

Figure 27:
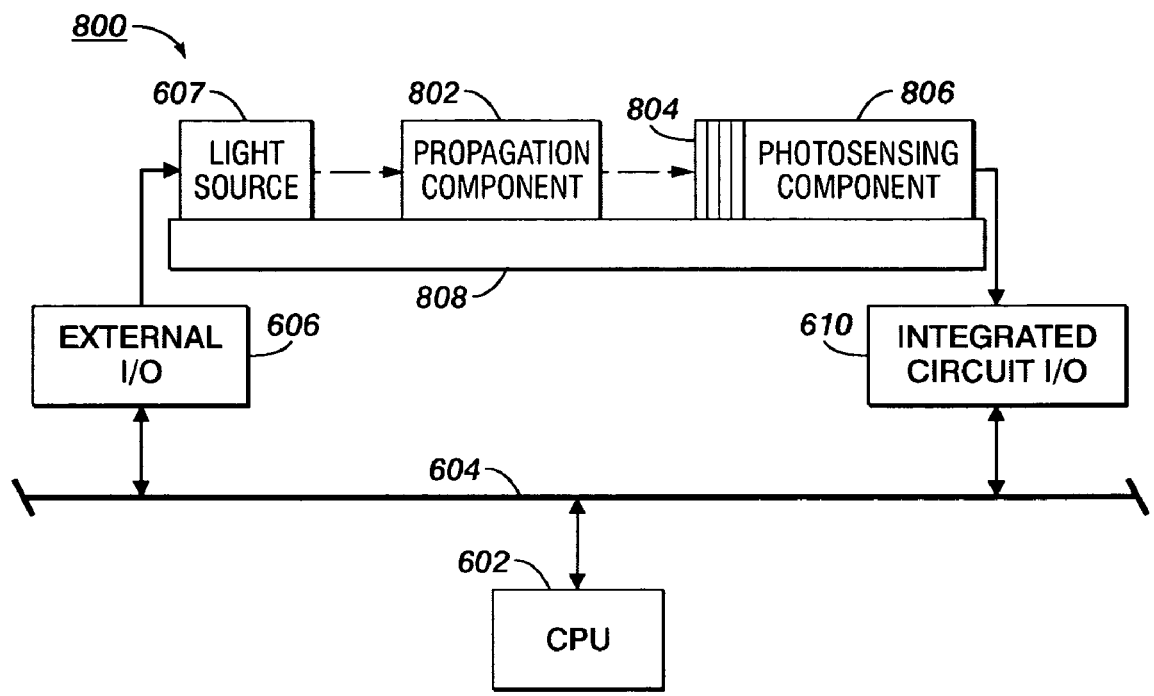
FIG. 27 is a schematic block diagram of a setup in which an implementation of the system of FIG. 19 controls a light source's output photon energy.

FIG. 27 schematically illustrates a setup in which components of system 600 as in FIG. 19 are connected to light source 607 and other components of detector 800. As shown, light from light source 607 is received at the entry surface of propagation component 802, and, after propagation, continues from the exit surface of propagation component 802 to transmission structure 804, which can be implemented as described above in relation to FIGS. 4-11 or 17. Light from transmission structure 804 is received by photosensing component 806, resulting in signals that indicate position information. As explained in Kiesel et al., the arrangement in FIG. 27 can be used to calibrate or test detector 802 or to measure wavelength or otherwise monitor light source 607.

As shown, light source 607, propagation component 802, transmission structure 804, and photosensing component 806 are all supported on support structure 808, which could be a support on which they are mounted or a substrate on which one or more of them is fabricated. The setup in FIG. 27 is applicable in many different ways, including, for example, removing a conventional wavelength- or temperature-stabilized laser, such as the type used in telecommunications applications, and replacing it with an actively wavelength-controlled semiconductor laser as described above, which is likely to be much less expensive than the conventional laser. All applications that require highly wavelength stabilized lasers are potential candidates for the techniques described herein.

In the setup shown in FIG. 27, monitoring routine 640 can, during calibration, set up a table or other suitable data structure in which each position indicated by photosensing component 806 is associated with a wavelength emitted by light source 607, which can be a reference light source with a tunable wavelength for this implementation. Then, to obtain absolute wavelength values for another light source, the other light source replaces light source 607 in the illustrated setup, and monitoring routine 640 uses each position indicated by photosensing component 806 to retrieve the associated wavelength from the calibration table.

The setup as shown in FIG. 27 can also be used to obtain relative wavelength values, such as by detecting changes in position indicated by photosensing component 806. For example, a position indicated at a first time can be compared with a position indicated at a second time to obtain a position change, and the position change can then be used to obtain wavelength shift information, another type of differential quantity.

Routine 640 can also obtain a respective differential quantity for each of a number of distributions that are received on a transmission structure's entry surface. Routine 640 can include or call subroutines to handle special cases, such as where distributions are received in sequence or in parallel.

In cases where first and second distributions are received in sequence or one after the other, routine 640 can obtain the first distribution's differential quantity before the second distribution is received. This will be achievable, for example, if there is a sufficiently long time period between the two distributions to allow CPU 602 to complete photosensing and then obtain the differential quantity. If the distributions resulted from different photon energies from a light source, the two differential quantities from the distributions could be compared to obtain information about the photon energy change.

Wavelength information obtained by routine 640 can be combined in an appropriate data structure (not shown), such as by forming a data array or list. After wavelength information has been obtained, CPU 602 can use the raw wavelength information, for example, to calculate or obtain from a calibration data structure a corresponding value for a light source's photon energy or photon energy change. CPU 602 can use photon energy information of these and other types to provide control signals to light source 607 through external I/O 606.

The techniques illustrated in FIGS. 20-27 may be implemented and applied to various types of lasers, including a wide variety of tunable lasers and also including, in addition to semiconductor lasers, lasers with various other structures, such as gas lasers, excimer lasers, solid state lasers, fiber lasers, and so forth. The illustrated techniques could be used with any appropriate tuning mechanism, including temperature tuning, laser current tuning, and mechanically tuning a laser cavity to select a specific emission wavelength from the gain spectrum.

In general, system 600 could be implemented with any devices that include light sources. Furthermore, system 600 could be implemented for many applications.

In general, any of the lenses described above can be implemented or replaced by any suitable type of refractive or diffractive optics, including but not limited to spherical lenses, Selfoc® lenses, and gradient index (GRIN) lenses. Also, any lens described in these examples might be replaced by a lens with similar functionality, e.g. a plano-concave lens might be replaced by a biconcave lens, and so forth.

Some of the implementations of FIGS. 1-27 illustrate examples of apparatus that includes a light source that provides a series of light pulses, a detector that includes a photosensing component, a transmission structure, and monitor circuitry. The transmission structure receives one or more of the light pulses from the light source, and, in response to each pulse, provides respective output light with an energy-dependent position on the photosensing component. The photosensing component senses the respective output light of at least one pulse during a respective series of one or more sense periods and provides respective sensing results, including information about the pulse's photon energy. The monitor circuitry is connected to receive the respective sensing results of each pulse whose output light is sensed.

Some of the implementations also illustrate examples of a method that, with a detector that includes a photosensing component, monitors a series of light pulses from a light source. The pulses are received through a transmission structure as described above. The act of monitoring includes sensing the respective output light of at least one pulse during its series of sense periods and producing respective sensing results for the pulse.

Also, some of the implementations of FIGS. 1-27 illustrate examples of apparatus that includes a light source as described above, a detector with a photosensing component, and monitor circuitry. The photosensing component senses the respective output light of at least one pulse during a respective series of one or more sense periods and provides respective sensing results. The monitor circuitry is connected to receive the sensing results and uses them to obtain a respective set of one or more differential quantities for the pulse, and the quantities include information about the pulse's photon energy.

Some of the implementations also illustrate examples of a method that, with a detector that includes a photosensing components, monitors a series of light pulses from a light source. In monitoring, the method senses at least one of the light pulses during a respective series of one or more sense periods and provides the pulse's respective sensing results to the monitor circuitry. For at least one light pulse, the method also operates the monitor circuitry to use the pulse's sensing results after the sense periods in its series to obtain a set of one or more differential quantities for the pulse.

Also, some of the implementations of FIGS. 1-27 illustrate examples of apparatus that includes a light source that provides a series of light pulses, each with a respective narrow photon energy band; a detector that includes a photosensing component; a transmission structure; and monitor circuitry. The transmission structure receives one or more of the light pulses and, in response, provides a respective light spot at a respective position on the photosensing component. The light spot of two pulses that have different energy bands have different positions. The photosensing component senses the light spot position of at least one light pulse during a respective series of sense periods and provides sensing results with position information. The monitor circuitry is connected to receive the sensing results of each pulse whose light spot position is sensed.

Some of the implementations also illustrate examples of a method that, with a detector that includes a photosensing component, monitors a series of light pulses from a light source, received through a transmission structure. Each light pulse has a narrow photon energy band, and the transmission structure, in response, provides a respective light spot at a respective position on the photosensing component. The light spots of two pulses with different energy bands have different respective positions. In the act of monitoring, the method also includes sensing the light spot position of at least one pulse during the pulse's series of sense periods and producing sensing results that include position information.

Some of the implementations also illustrate examples of apparatus including a light source that provides a series of light pulses, a detector that includes a photosensing array with two or more cells, and monitor circuitry. At least two cells of the array sense light pulses and provide readout signals. The cells sense each light pulse during a respective series of one or more sense periods. The monitor circuitry is connected to receive readout signals from the photosensing array. After each sense period in the respective series of a pulse, the monitor circuitry receives respective readout signals from only two cells of the array.

Some of the implementations also illustrate examples of a method in which, with a detector that includes a photosensing array as described above, a series of light pulses from a light source is monitored. The act of monitoring includes sensing at least one of the pulses and providing sensing results, with each pulse being sensed during a respective series of one or more sense periods. After each sense of at least one pulse, the method reads out respective sensing results from only two cells of the photosensing array.

Some of the implementations of FIGS. 1-27 also illustrate examples of systems and devices with features as described above.

In specific implementations, the energy-dependent position can be a light spot position, a central energy position, or a peak energy position. If sensing results are read out from first and second cells of an array, a differential quantity can be obtained based on the sensing results and can be used to monitor photon energy of light pulses; for example, if each light pulse is in a subrange of photon energies with a central energy, the differential quantity can be a difference between central energies of different pulses. Or the differential quantity can indicate relative quantities of photons received by two cells. Specifically, a processor can use the differential quantity to monitor photon energy of pulses, such as by determining a photon energy value for a pulse.

In specific implementations, each light pulse can be provided during a respective emission period. The monitor circuitry can provide pulse signals to the light source causing it to provide the pulses and sense signals to the photosensing component causing it to sense each light pulse during the respective series of sense periods. The pulse signals and sense signals can together synchronize the emission period and series of sense periods of at least one light pulse. In one example, the pulse signals and sense signals can be provided so that each sense period begins before a respective emission period begins and ends after the emission period ends. In any case, a light pulse's sensing results can indicate photons photosensed by the photosensing component during the pulse's sense period.

In specific implementations, each light pulse is similarly provided during an emission period, and consecutive sense periods are sufficiently close in time that the series of sense periods of each light pulse includes at least one sense period that is completed during the emission period. In other specific implementations, each light pulse is photosensed, such as by control sensing circuitry, and, in response, a first sense period in its series of sense periods is caused to begin.

In specific implementations, the light source includes a laser or a laser cavity, and the laser can be caused to provide laser pulses by pulse signals. Similarly, the light source can provide light in a narrow band. An optical fiber can receive light pulses from the light source and guide the pulses to the photosensing array or other component of the detector. The optical fiber can be a single-mode optical fiber.

In specific implementations, the photosensing component can include a photosensitive surface and the transmission structure can include a coating over the photosensitive surface. The transmission structure can be a layered structure with a laterally varying transmission function; it can include, for example, a graded Fabry-Perot cavity with two sets of distributed Bragg mirrors and, between them, a laterally graded cavity; each pulse can be spread across approximately an entire surface of one of the distributed Bragg mirrors. In general, the transmission structure can be used to provide, in response to each light pulse, a light spot in accordance with a laterally varying photon energy distribution.

In specific implementations, the photosensing component can include a position-sensitive detector or a photosensing array. Free charge carriers can be generated in response to light, such as from a transmission structure, and sensing circuitry in the photosensing component can accumulate the charge carriers during sense periods, using the accumulated charge carriers to provide readout signals after one or more of the sense periods. The detector can, for example, include an IC with a photosensing array that has CCD readout or CMOS readout.

In specific implementations, the monitor circuitry can include a processor, such as a central processing unit (CPU).

In specific implementations in which a photosensing component produces sensing results for each sense period that is synchronized with an emission period, a method can use sensing results to obtain readout signals indicating, for each sense period, a respective photosensed quantity of light. The readout signals can be used to monitor photon energy of pulses from the light source. Also, in implementations in which each light pulse is in a subrange with a central energy, differences between central energies of different pulses can be determined.

In specific implementations with a tunable light source in which each pulse's narrow energy band has a central energy, monitoring light can include determining that a first pulse's central energy is changed from a previous pulse's central energy based on the first pulse's sensed light spot position. Then, pulse signals can be provided causing the light source to provide a second light pulse with a central energy closer to the previous light pulse's central energy than the first light pulse's. If readout signals from a detector indicate sensed light spot positions, change in the first pulse's central energy can be determined by using the readout signals to obtain an absolute measurement of central energy and comparing the absolute measurement with an absolute measurement of the previous pulse's central energy. In causing the light source to provide the second pulse, pulse signals can provide the second pulse's central energy incrementally closer to the previous pulse's central energy than the first pulse's central energy is and this can be done without using calibration data.

In general, many additional techniques could be employed in the implementations of FIGS. 1-27, such as adjusting photosensed quantities from subrange cells based on photosensed quantities from reference cells, as described in greater detail in co-pending U.S. patent application Ser. No. 11/316,438, entitled "Photosensing Throughout Energy Range and in Subranges" and incorporated herein by reference. This adjustment could be performed on analog quantities or, after conversion to digital values, on digital quantities.

The implementations in FIGS. 1-27 illustrate various applications of techniques as described above, including monitoring photon energy from pulsed lasers and other pulsed light sources. The techniques could be readily extended to perform other operations in addition to monitoring photon energy, such as monitoring intensity; some such extensions could be made simply by software modifications, such as to provide a combined power/wavelength monitor. Techniques involving monitoring photon energy of light pulses, as exemplified by the implementations in FIGS. 1-27, can also be applied in many other applications. Some other applications in which the techniques might be implemented are described in copending U.S. patent application Ser. No. 11/633,302, entitled "Position-Based Response to Light" and incorporated herein by reference in its entirety; the described applications include, for example, a camera implementation and an implementation with a position-sensitive detector, either of which could receive pulses from a light source such as a periodically pulsed laser or a randomly pulsing laser, with calibration being used as appropriate to obtain desired photon energy information.

Various of the techniques described above have been successfully implemented or simulated, including the production of a detector that includes a commercially available IC covered with a laterally graded Fabry-Perot cavity filter on a glass slide. Wavelength resolution has been experimentally determined and successfully simulated on a computer. As described above, wavelength measurement for a semiconductor laser has been successfully performed by using a single-mode optical fiber to propagate light to a detector coated with a laterally varying Fabry-Perot coating.

The exemplary implementations described above are advantageous because they can provide compact, inexpensive components to perform operations such as photon energy monitoring of pulsed lasers and other pulsed light sources. In general, the techniques can be implemented in existing sensors and photosensors.

The exemplary implementations described above generally rely on transmission structures that include highly reflective interfaces, so that much of the incident light is reflected and only a small fraction reaches the photosensor array. Therefore, the techniques described above are especially useful in applications in which light intensity is very high or a light source emits through a large area. In addition, the above techniques make it possible to increase sensitivity by choosing simpler optics and no dispersion element. By contrast, some conventional systems such as monochromators lose all light defracted into the $0^{th}$, $2^{nd}$, and higher orders. In the implementations described above, very high light yield can be achieved by combining a transmission structure with a highly sensitive photosensor array, such as one that includes avalanche photodetectors.

In addition, components could have various shapes, dimensions, or other numerical or qualitative characteristics other than those illustrated and described above. For example, in the exemplary implementations described above, cells of a photosensor array photosense in different subranges of an application's photon energy range. The subranges of cells could have any appropriate widths and relationships, and could, for example, overlap or be distinct. The width of a cell's subrange can be chosen by designing the transmission structure and the cell sensing area; for example, the width may be as small as 0.1 nm or as great as tens of nanometers.

Some of the above exemplary implementations involve specific materials, such as in photosensor arrays or position-sensitive detectors and transmission structures, but the invention could be implemented with a wide variety of materials and with layered structures with various combinations of sublayers. In particular, photosensor arrays for a desired speed, sensitivity and wavelength range could have any suitable material, such as silicon, germanium, indium-gallium-arsenide, gallium arsenide, gallium nitride, or lead sulphide, and could be produced with any appropriate kind of devices, including, for example, photodiodes, avalanche photodiodes, p-i-n diodes, photoconductors, and so forth, with any appropriate technique for sensing and reading out information whether based on CCD, CMOS, or other techniques. Various commercially available detector arrays have pixel densities as high as ten megapixels, and some high density ICs have become relatively inexpensive.

Similarly, transmission structures could be fabricated with any appropriate techniques, including thin film technology such as sputtering, e-beam or thermal evaporation with or without plasma assistance, epitaxial growth, MBE, MOCVD, and so forth. To produce Bragg mirrors, appropriate pairs of materials with low absorption coefficients and large difference in refractive indices could be chosen, bearing in mind the photon energies of interest; exemplary materials include $SiO_2/TiO_2$, $SiO_2/Ta_2O_5$, GaAs/AlAs, and GaAs/AlGaAs. Thicknesses of layer in transmission structures may vary from 30 nm up to a few hundred nanometers.

Some of the above exemplary implementations involve particular types of transmission structures, such as Bragg mirrors and paired distributed Bragg reflectors separated by a Fabry-Perot cavity, but these transmission structures are merely exemplary, and any appropriate transmission structure could be used to produce a laterally varying energy distribution. Various techniques could be used to produce transmission structures with laterally varying optical thickness in addition to those described above, including, during deposition, tilting the substrate, using a shadow mask, or using a temperature gradient to obtain graded layer thickness; also, during homogeneous deposition, off-axis doping, such as by e-beam, MBE, or MOVPE, could produce lateral variation.

Some of the above exemplary implementations use specific lasers or other light sources or specific propagation components to obtain light with desired characteristics, but various other light source techniques and propagation components could be used within the scope of the invention.

The exemplary implementations in FIGS. 19-27 employ a CPU, which could be a microprocessor or any other appropriate component. Furthermore, as noted above, comparison, adjustment, and other operations on photosensed quantities could be done either digitally or with analog signals, and could be done either on the same IC as the photosensor array, on other components, or on a combination of the two, with any appropriate combination of software or hardware.

The above exemplary implementations generally involve production and use of ICs, light sources, transmission structures, propagation components, and monitoring circuitry following particular operations, but different operations could be performed, the order of the operations could be modified, and additional operations could be added within the scope of the invention. For example, in implementations in which a transmission structure is on a separate substrate from a photosensor array, the transmission structure could be moved relative to the photosensor array between consecutive monitoring operations. Also, readout of adjusted or unadjusted photosensed quantities from an IC could be performed serially or in parallel, and could be performed cell-by-cell or in a streaming operation.

While the invention has been described in conjunction with specific exemplary implementations, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. Apparatus comprising:
    a light source that provides a series of light pulses;
    a detector that includes a photosensing component;
    a transmission structure that receives one or more of the light pulses from the light source and, in response to each received light pulse, provides respective output light with an energy-dependent position on the photosensing component; the photosensing component sensing the respective output light of at least one of the light pulses and providing respective sensing results that include information about the light pulse's photon energy; and
    monitor circuitry connected to receive the respective sensing results of each light pulse whose respective output light is sensed.

2. The apparatus of claim 1 in which each light pulse includes a respective subrange of a range of photon energies in which the light source provides light; the light source, the transmission structure, and the photosensing component being configured so that the respective output light of each received light pulse includes a respective light spot having a respective position on the photosensing component; the photosensing component sensing the respective light spot of at least one of the received light pulses and providing respective sensing results that include information about the light pulse's light spot position.

3. The apparatus of claim 2 in which the information about the light pulse's light spot position includes information about at least one of a central energy position and a peak energy position.

4. The apparatus of claim 2 in which the monitor circuitry uses the light pulse's sensing results to obtain a respective set of one or more differential quantities for the light pulse, the set of differential quantities including information about the light pulse's subrange of photon energies.

5. The apparatus of claim 4 in which the photosensing component comprises:
    an IC that includes a photosensing array, the photosensing array including first and second sets of one or more cells; the relative quantities of photons received by the first and second sets of cells changing between first and second light pulses in the series; each differential quantity in each pulse's set indicating relative quantities of photons received by the first and second sets of cells.

6. The apparatus of claim 1 in which the light source provides each light pulse during a respective emission period, each light pulse is sufficiently spreaded over an entry surface of the transmission structure that its energy-dependent position on the photosensing component includes information about its photon energy, and the photosensing component performs photosensing during a series of sense periods; the series including, for each light pulse whose respective output light is sensed, a subseries of one or more sense periods during which the photosensing component senses the light pulse's respective output light; each light pulse's subseries of sense periods including at least one of:
    a single sense period that begins no later than the light pulse's emission period begins and ends no earlier than the emission period ends;
    two or more sense periods, consecutive sense periods in the subseries being sufficiently close in time that at least one sense period in the subseries is completed during the light pulse's emission period;
    a single sense period that is caused to begin during the light pulse's emission period and ends after the emission period ends; and
    more than one sense period, a first sense period in the subseries being caused to begin during the light pulse's emission period.

7. The apparatus of claim 6 in which the monitor circuitry further comprises:
    control sensing circuitry that photosenses each light pulse and, in response, causes a first sense period in the light pulse's subseries of sense periods to begin.

8. A method of using the apparatus of claim 6 to monitor light, the method comprising:
    monitoring the series of light pulses from the light source, received through the transmission structure; the act of monitoring the series of light pulses comprising:
        with the photosensing component, sensing the respective output light of at least one of the light pulses in the series during its respective subseries of sense periods and producing respective sensing results for the light pulse.

9. The method of claim 8 in which the act of monitoring further comprises:
    photosensing each light pulse and, in response, causing a first sense period in the light pulse's subseries of sense periods to begin.

10. A method of using apparatus; the apparatus including:
    a light source that provides a series of light pulses; the light source providing each light pulse during a respective emission period;
    a detector that includes a photosensing component;
    a transmission structure that receives one or more of the light pulses from the light source and, in response to each received light pulse, provides respective output light with an energy-dependent position on the photosensing component; the photosensing component sensing the respective output light of at least one of the light pulses and providing respective sensing results that include information about the light pulse's photon energy; the photosensing component performing photosensing during a series of sense periods; the series including, for each light pulse whose respective output light is sensed, a subseries of one or more sense periods during which the photosensing component senses the light pulse's respective output light; and
    monitor circuitry connected to receive the respective sensing results of each light pulse whose respective output light is sensed;
    the method comprising:
    monitoring the series of light pulses from the light source, received through the transmission structure; the act of monitoring the series of light pulses comprising:

with the photosensing component, sensing the respective output light of at least one of the light pulses in the series during its respective subseries of sense periods and producing respective sensing results for the light pulse;

providing pulse signals to the light source, causing the light source to provide the light pulses; and providing sense signals to the photosensing component, causing the photosensing component to sense the respective output light of at least one of the light pulses in the series during its respective subseries of sense periods;

the pulse signals and sense signals together synchronizing the emission period and subseries of sense periods of at least one light pulse whose respective output light is sensed.

11. The method of claim 10 in which the act of monitoring further comprises:

providing the pulse signals and the sense signals so that each sense period begins before a respective emission period begins and ends after the respective emission period ends.

12. A method of using apparatus; the apparatus including:

a light source that provides a series of light pulses; the light source providing each light pulse during a respective emission period;

a detector that includes a photosensing component;

a transmission structure that receives one or more of the light pulses from the light source and, in response to each received light pulse, provides respective output light with an energy-dependent position on the photosensing component; the photosensing component sensing the respective output light of at least one of the light pulses and providing respective sensing results that include information about the light pulse's photon energy; the photosensing component performing photosensing during a series of sense periods; the series including, for each light pulse whose respective output light is sensed, a subseries of one or more sense periods during which the photosensing component senses the light pulse's respective output light; consecutive sense periods being sufficiently close in time that the respective subseries of sense periods of each light pulse whose respective output light is sensed includes at least one sense period that is completed during the respective emission period; and monitor circuitry connected to receive the respective sensing results of each light pulse whose respective output light is sensed;

the method comprising:

monitoring the series of light pulses from the light source, received through the transmission structure; the act of monitoring the series of light pulses comprising:

with the photosensing component, sensing the respective output light of at least one of the light pulses in the series during its respective subseries of sense periods and producing respective sensing results for the light pulse.

13. A method of using apparatus to monitor light, the apparatus including:

a light source;

a photosensing component; and a transmission structure;

the method comprising:

with the light source, providing a series of light pulses; and monitoring the series of light pulses from the light source; the act of monitoring the series of light pulses comprising:

spreading each light pulse in the series over an entry surface of the transmission structure;

with the transmission structure, receiving the series of light pulses and, in response to each light pulse, providing respective output light with a respective energy-dependent position on the photosensing component;

with the photosensing component, sensing the respective output light of at least one of the light pulses in the series to obtain respective sensing results, the light pulse being sufficiently spreaded that the sensing results include information about the light pulse's photon energy based on its output light's energy-dependent position; the act of sensing including, for each light pulse whose respective output light is sensed:

sensing the light pulse's output light during a respective series of one or more sense periods for the light pulse; and for at least one light pulse whose respective output light is sensed, using the light pulse's respective sensing results from the photosensing component after the sense periods in the light pulse's respective series to obtain a respective set of one or more differential quantities for the light pulse, the set of differential quantities including information about the light pulse's photon energy.

14. The method of claim 13 in which each light pulse is provided during a respective emission period; the act of monitoring further comprising:

providing pulse signals to the light source, causing the light source to provide the light pulses; and providing sense signals to the photosensing component, causing the photosensing component to sense each light pulse during its respective series of sense periods;

the pulse signals and sense signals together synchronizing the emission period and series of sense periods of at least one light pulse for which a respective set of differential quantities is obtained.

15. The method of claim 13 in which each light pulse is provided during a respective emission period; consecutive sense periods being sufficiently close in time that the respective series of sense periods of each light pulse for which a respective set of differential quantities is obtained includes at least one sense period that is completed during the respective emission period.

16. The method of claim 13 in which the act of monitoring further comprises:

photosensing each light pulse and, in response, causing a first sense period in the light pulse's series of sense periods to begin.

17. The method of claim 13 in which the photosensing component includes a photosensing array and in which sensing results are read out from first and second cells of the photosensing array, the method further comprising:

using sensing results read out from the first and second cells after one of the sense periods in a light pulse's respective series to obtain one of the differential quantities in the light pulse's respective set.

18. The method of claim 13, further comprising:

using the light pulses' respective sets of differential quantities to monitor photon energy of the light pulses.

19. The method of claim 18 in which the light source provides each light pulse in a respective subrange of photon energies, each of the light pulses' respective subranges having a respective central energy, the central energies of different light pulses being different, the act of using the respective sets of differential quantities comprising:
   determining differences between central energies of different light pulses.

20. Apparatus comprising:
   a light source that provides a series of light pulses, each light pulse having a respective narrow photon energy band;
   a detector that includes a photosensing component;
   a transmission structure that receives one or more of the light pulses from the light source and, in response to each received light pulse, provides a respective light spot at a respective position on the photosensing component; the respective light spots of two of the light pulses that have different respective energy bands having different respective positions on the photosensing component; the photosensing component sensing the respective light spot position of at least one of the light pulses and providing respective sensing results that include position information; and
   monitor circuitry connected to receive the respective sensing results of each light pulse whose respective light spot position is sensed.

21. The apparatus of claim 20 in which the light source includes a laser cavity; each light pulse being emitted from the laser cavity with its respective narrow photon energy band.

22. The apparatus of claim 20 in which the monitor circuitry uses the readout signals to determine a photon energy value for the light pulse.

23. The apparatus of claim 20, further comprising:
   an optical fiber that receives light pulses from the light source and guides the received light pulses to the detector.

24. The apparatus of claim 23 in which the optical fiber is a single-mode optical fiber.

25. The apparatus of claim 20 in which the light source provides each light pulse during a respective emission period, each light pulse is sufficiently spreaded over an entry surface of the transmission structure that its light spot's position on the photosensing component includes information about its energy band, and the photosensing component performs photosensing during a series of sense periods; the series of sense periods including, for each light pulse whose respective light spot position is sensed, a subseries of one or more sense periods during which the photosensing component senses the light pulse's respective light spot position; each light pulse's subseries of sense periods including at least one of:
   a single sense period that begins no later than the light pulse's emission period begins and ends no earlier than the emission period ends;
   two or more sense periods, consecutive sense periods in the subseries being sufficiently close in time that at least one sense period in the subseries is completed during the light pulse's emission period;
   a single sense period that is caused to begin during the light pulse's emission period and ends after the emission period ends; and
   more than one sense period, a first sense period in the subseries being caused to begin during the light pulse's emission period.

26. The apparatus of claim 25 in which the monitor circuitry further comprises:
   control sensing circuitry that photosenses each light pulse and, in response, causes a first sense period in the light pulse's subseries of sense periods to begin.

27. A method of using apparatus to monitor light, the apparatus including:
   a light source;
   a photosensing component; and
   a transmission structure;
the method comprising:
   with the light source, providing a series of light pulses, each light pulse having a respective narrow photon energy band and being provided during a respective emission period; and
   monitoring the series of light pulses from the light source, received through the transmission structure; in response to each light pulse, the transmission structure providing a respective light spot at a respective position on the photosensing component; two of the light pulses having different respective energy bands and their respective light spots having different respective positions on the photosensing component; the act of monitoring the series of light pulses comprising:
      with the photosensing component, sensing the respective light spot position of at least one of the light pulses in the series during a respective series of sense periods and producing respective sensing results that include position information; the light pulse's series of sense periods including at least one of:
         a single sense period that begins no later than the light Pulse's emission period begins and ends no earlier than the emission period ends;
         two or more sense periods, consecutive sense periods in the series being sufficiently close in time that at least one sense period in the series is completed during the light pulse's emission period;
         a single sense period that is caused to begin during the light pulse's emission period and ends after the emission period ends; and
         more than one sense period, a first sense period in the series being caused to begin during the light pulse's emission period.

28. The method of claim 27 in which each light pulse is provided during a respective emission period; the act of monitoring further comprising:
   providing pulse signals to the light source, causing the light source to provide the light pulses; and
   providing sense signals to the photosensing component, causing the photosensing component to sense each light pulse during its respective subseries of sense periods;
   the pulse signals and sense signals together synchronizing the emission period and subseries of sense periods of at least one light pulse whose respective light spot position is sensed.

29. The method of claim 27 in which each light pulse is provided during a respective emission period; consecutive sense periods being sufficiently close in time that the respective subseries of sense periods of each light pulse whose respective light spot position is sensed includes at least one sense period that is completed during the respective emission period.

30. The method of claim 27 in which the act of monitoring further comprises:
   photosensing each light pulse and, in response, causing a first sense period in the light pulse's subseries of sense periods to begin.

31. A method of using apparatus to monitor light, the apparatus including:

a tunable light source;
a photosensing component; and
a transmission structure; the method comprising:
with the light source, providing a series of light pulses, each light pulse having a respective narrow photon energy band that has a respective central energy; and
monitoring the series of light pulses from the light source, received through the transmission structure; in response to each light pulse, the transmission structure providing a respective light spot at a respective position on the photosensing component; two of the light pulses having different respective energy bands and their respective light spots having different respective positions on the photosensing component; the act of monitoring the series of light pulses comprising:
with the photosensing component, sensing the respective light spot position of at least one of the light pulses in the series during a respective series of sense periods and producing respective sensing results that include position information;
based on the sensed light spot position of a first one of the light pulses, determining that the first light pulse's central energy is changed from a previous light pulse's central energy; and
providing pulse signals that cause the light source to provide a second one of the light pulses with a central energy closer to the previous light pulse's central energy than the first light pulse's central energy is.

32. The method of claim 31, further comprising:
obtaining readout signals from the detector, the readout signals indicating sensed light spot positions;
the act of determining that the first light pulse's central energy is changed comprising:
using the readout signals to obtaining an absolute measurement of the first light pulse's central energy; and
comparing the absolute measurement of the first light pulse's central energy with an absolute measurement of the previous light pulse's central energy.

33. The method of claim 31 in which the act of providing pulse signals that cause the light source to provide the second light pulse comprises:
providing the pulse signals that cause the light source to provide the second light pulse without using calibration data, the second light pulse's central energy being incrementally closer to the previous light pulse's central energy than the first light pulse's central energy is.

34. A method of using apparatus to monitor light, the apparatus including:
a photosensing component; and
a transmission structure;
the method comprising:
receiving a series of light pulses through the transmission structure, each light pulse being received during a respective emission period and being spreaded over an entry surface of the transmission structure; in response to each light pulse, the transmission structure providing respective output light with an energy-dependent position on the photosensing component;
for each of a number of the light pulses in the series, operating the photosensing component to sense the respective output light of the light pulse and producing respective sensing results, the light pulse being sufficiently spreaded over the transmission structure's entry surface that the sensing results include information about the light pulse's photon energy based on its energy-dependent position; and
using the sensing results to monitor the series of light pulses;
the act of operating the photosensing component and producing respective sensing results including:
photosensing the light pulse's respective output light during a respective series of one or more sense periods; the light pulse's series of sense periods including at least one of:
a single sense period that begins no later than the light pulse's emission period begins and ends no earlier than the emission period ends;
two or more sense periods, consecutive sense periods in the series being sufficiently close in time that at least one sense period in the series is completed during the light pulse's emission period;
a single sense period that is caused to begin during the light pulse's emission period and ends after the emission period ends; and
more than one sense period, a first sense period in the series being caused to begin during the light pulse's emission period.

* * * * *